(12) United States Patent
Choi et al.

(10) Patent No.: US 8,834,749 B2
(45) Date of Patent: Sep. 16, 2014

(54) PHOTOSENSITIVE RESIN COMPOSITION AND LIGHT BLOCKING LAYER USING THE SAME

(71) Applicant: Cheil Industries Inc., Gumi-si (KR)

(72) Inventors: Hyun-Moo Choi, Uiwang-si (KR); Chang-Min Lee, Uiwang-si (KR); Ji-Hye Kim, Uiwang-si (KR); Kyung-Won Ahn, Uiwang-si (KR); A-Rum Yu, Uiwang-si (KR); Jae-Bum Yim, Uiwang-si (KR); Hwan-Sung Cheon, Uiwang-si (KR); Ju-Ho Jung, Uiwang-si (KR)

(73) Assignee: Cheil Industries Inc., Gumi-si (KR)

( * ) Notice: Subject to any disclaimer, the term of this patent is extended or adjusted under 35 U.S.C. 154(b) by 0 days.

(21) Appl. No.: 13/947,232

(22) Filed: Jul. 22, 2013

(65) Prior Publication Data

US 2014/0175343 A1 Jun. 26, 2014

(30) Foreign Application Priority Data

Dec. 21, 2012 (KR) .................. 10-2012-0151245
Dec. 21, 2012 (KR) .................. 10-2012-0151246

(51) Int. Cl.
| | |
|---|---|
| *F21V 9/00* | (2006.01) |
| *G02B 5/02* | (2006.01) |
| *G02C 7/10* | (2006.01) |
| *G02F 1/361* | (2006.01) |
| *G03B 11/00* | (2006.01) |
| *G02B 5/23* | (2006.01) |
| *G03C 1/00* | (2006.01) |
| *G03F 7/00* | (2006.01) |
| *G02F 1/1335* | (2006.01) |

(52) U.S. Cl.
CPC ................... *G03F 7/0007* (2013.01)
USPC ........... 252/582; 252/586; 349/106; 359/891; 430/7; 430/270.1; 544/230; 546/15; 548/147; 548/216; 548/300.7; 548/407

(58) Field of Classification Search
USPC ....... 252/582, 586; 349/106; 359/891; 430/7, 430/270.1; 544/230; 546/15; 548/147, 216, 548/300.7, 407
See application file for complete search history.

(56) References Cited

U.S. PATENT DOCUMENTS

| | | | |
|---|---|---|---|
| 8,273,270 B2 | 9/2012 | Lee et al. | |
| 8,298,454 B2 | 10/2012 | Lee et al. | |
| 2011/0151379 A1 | 6/2011 | Choi et al. | |
| 2012/0077897 A1* | 3/2012 | Choi et al. | 522/81 |
| 2012/0091407 A1* | 4/2012 | Lee et al. | 252/582 |
| 2012/0145971 A1* | 6/2012 | Lee et al. | 252/582 |
| 2012/0161088 A1* | 6/2012 | Choi et al. | 252/586 |
| 2012/0196949 A1* | 8/2012 | Heo et al. | 522/63 |

FOREIGN PATENT DOCUMENTS

| | | |
|---|---|---|
| JP | 4239663 | 11/2004 |
| JP | 2009-014970 | 1/2009 |
| KR | 10-2000-0008133 A | 2/2000 |
| KR | 10-0894835 | 10/2007 |
| KR | 10-1068622 A | 6/2011 |
| KR | 10-2012-0045076 A | 5/2012 |
| KR | 10-2012-0045077 A | 5/2012 |
| KR | 10-2012-0078495 A | 7/2012 |
| KR | 10-2012-0078513 A | 7/2012 |
| KR | 10-2012-0105570 A | 9/2012 |
| KR | 10-2012-0105571 A | 9/2012 |
| WO | 2012/091401 A2 | 7/2012 |

* cited by examiner

*Primary Examiner* — Bijan Ahvazi
(74) *Attorney, Agent, or Firm* — Additon, Higgins & Pendleton, P.A.

(57) ABSTRACT

Disclosed are a photosensitive resin composition including (A) a binder resin including a cardo-based resin including a repeating unit represented by the following Chemical Formula 1, (B) a photopolymerizable monomer, (C) a photopolymerization initiator, (D) a colorant and (E) a solvent, and a light blocking layer using the same. In the above Chemical Formula 1, each substituent is the same as defined in the detailed description.

10 ~ 90% transmission (half tone or slit type)   100% transmission

[Chemical Formula 1]
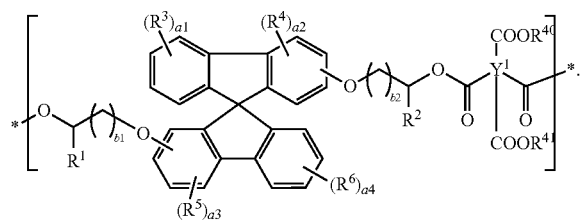
12 Claims, 8 Drawing Sheets

100% light blocking

10 ~ 90% transmission
(half tone or slit type)

100% transmission

PHOTOSENSITIVE RESIN COMPOSITION AND LIGHT BLOCKING LAYER USING THE SAME

CROSS-REFERENCE TO RELATED APPLICATION

This application claims priority to and the benefit of Korean Patent Application Nos. 10-2012-0151245 and 10-2012-0151246, each filed in the Korean Intellectual Property Office on Dec. 21, 2012, the entire disclosure of each of which is incorporated herein by reference.

FIELD

This disclosure relates to a photosensitive resin composition and a light blocking layer using the same.

BACKGROUND

A liquid crystal display device includes a lower substrate on which a color filter including a light blocking layer and an ITO pixel electrode are formed; an active circuit portion including a liquid crystal layer, a thin film transistor, and a capacitor layer; and an upper substrate on which an ITO pixel electrode is formed.

The light blocking layer blocks uncontrolled light transmitted out of a transparent pixel electrode of a substrate and thus prevents contrast reduction due to light transmitted through a thin film transistor. Red, green, and blue light blocking layers transmit light with a predetermined wavelength of white light and display colors.

There has been a recent focus on the manufacture of light blocking layers using a multifunctional material such as a material simultaneously having two functions in one process. For example, a black column spacer capable of simultaneously functioning as a black matrix and a column spacer may be realized using one material in one process.

The black column spacer may provide the black matrix and the column spacer with the same pattern. The pattern is required to have a film step difference between a more exposed region and a less exposed region by using a half tone mask or a slit mask during the pattern formation.

SUMMARY

One embodiment provides a photosensitive resin composition that can have excellent pattern-forming capability, developability, and/or chemical resistance as well as being capable of controlling a pattern tilt angle to have a film step difference during formation of a pattern.

Another embodiment provides a light blocking layer manufactured by using the photosensitive resin composition.

One embodiment provides a photosensitive resin composition that includes (A) a binder resin including a cardo-based resin including a repeating unit represented by the following Chemical Formula 1; (B) a photopolymerizable monomer; (C) a photopolymerization initiator; (D) a colorant; and (E) a solvent.

[Chemical Formula 1]

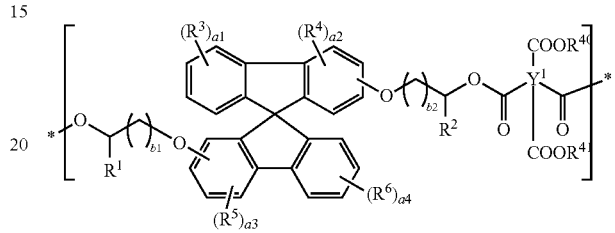

In the above Chemical Formula 1, $Y^1$ is a residual group of acid dianhydride, $R^1$, $R^2$, $R^{40}$ and $R^{41}$ are the same or different and are each independently hydrogen, substituted or unsubstituted C1 to C20 alkyl, substituted or unsubstituted C2 to C20 alkenyl, substituted or unsubstituted C2 to C20 alkynyl, substituted or unsubstituted C1 to C20 alkoxy, substituted or unsubstituted C3 to C20 cycloalkyl, substituted or unsubstituted C3 to C20 cycloalkenyl, substituted or unsubstituted C3 to C20 cycloalkynyl, substituted or unsubstituted C6 to C30 aryl, or substituted or unsubstituted (meth)acrylate, wherein at least one of $R^1$ and $R^2$ or at least one of $R^{40}$ and $R^{41}$ is substituted or unsubstituted (meth)acrylate, $R^3$ to $R^6$ are the same or different and are each independently substituted or unsubstituted C1 to C20 alkyl, substituted or unsubstituted C2 to C20 alkenyl, substituted or unsubstituted C2 to C20 alkynyl, substituted or unsubstituted C1 to C20 alkoxy, substituted or unsubstituted C3 to C20 cycloalkyl, substituted or unsubstituted C3 to C20 cycloalkenyl, substituted or unsubstituted C3 to C20 cycloalkynyl, or substituted or unsubstituted C6 to C30 aryl, $a^1$ to $a^4$ are the same or different and are each independently integers ranging from 0 to 4, and $b^1$ and $b^2$ are the same or different and are each independently integers ranging from 0 to 10.

The cardo-based resin may be a compound represented by the following Chemical Formula 2.

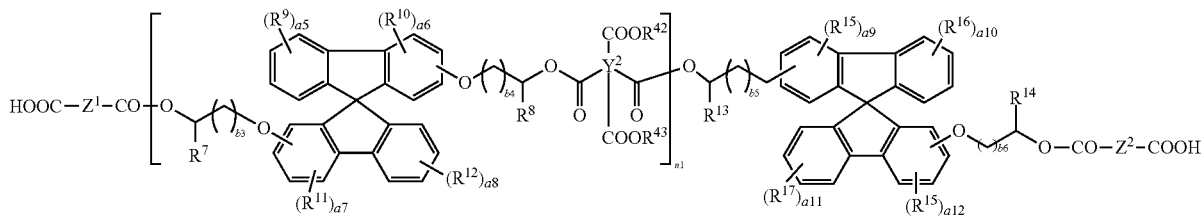

In the above Chemical Formula 2, $Y^2$ is a residual group of acid dianhydride, $Z^1$ and $Z^2$ are the same or different and are each independently a residual group of acid anhydride, $R^7$, $R^8$, $R^{13}$, $R^{14}$, $R^{42}$ and $R^{43}$ are the same or different and are each independently hydrogen, substituted or unsubstituted C1 to C20 alkyl, substituted or unsubstituted C2 to C20 alkenyl, substituted or unsubstituted C2 to C20 alkynyl, substituted or unsubstituted C1 to C20 alkoxy, substituted or unsubstituted C3 to C20 cycloalkyl, substituted or unsubstituted C3 to C20 cycloalkenyl, substituted or unsubstituted C3 to C20 cycloalkynyl, substituted or unsubstituted C6 to C30 aryl, or substituted or unsubstituted (meth)acrylate, wherein at least one of $R^7$ and $R^8$, at least one of $R^{13}$ and $R^{14}$, or at least one of $R^{42}$ and $R^{43}$ is independently substituted or unsubstituted (meth)acrylate, $R^9$ to $R^{12}$ and $R^{15}$ to $R^{18}$ are the same or different and are each independently substituted or unsubstituted C1 to C20 alkyl, substituted or unsubstituted C2 to C20 alkenyl, substituted or unsubstituted C2 to C20 alkynyl, substituted or unsubstituted C1 to C20 alkoxy, substituted or unsubstituted C3 to C20 cycloalkyl, substituted or unsubstituted C3 to C20 cycloalkenyl, substituted or unsubstituted C3 to C20 cycloalkynyl, or substituted or unsubstituted C6 to C30 aryl, $a^5$ to $a^{12}$ are the same or different and are each independently integers ranging from 0 to 4, $b^3$ to $b^6$ are the same or different and are each independently integers ranging from 0 to 10, and $n^1$ is an integer ranging from 1 to 20.

When $R^1$ and $R^2$ are hydrogen, and at least one of $R^{40}$ and $R^{41}$ is substituted or unsubstituted (meth)acrylate in the above Chemical Formula 1, the cardo-based resin may further include a repeating unit represented by the following Chemical Formula 5.

[Chemical Formula 5]

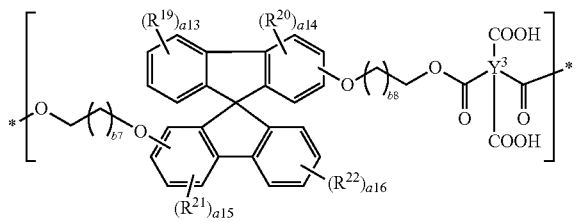

In the above Chemical Formula 5, $Y^3$ is a residual group of acid dianhydride, $R^{19}$ to $R^{22}$ are the same or different and are each independently substituted or unsubstituted C1 to C20 alkyl, substituted or unsubstituted C2 to C20 alkenyl, substituted or unsubstituted C2 to C20 alkynyl, substituted or unsubstituted C1 to C20 alkoxy, substituted or unsubstituted C3 to C20 cycloalkyl, substituted or unsubstituted C3 to C20 cycloalkenyl, substituted or unsubstituted C3 to C20 cycloalkynyl, or substituted or unsubstituted C6 to C30 aryl, $a^{13}$ to $a^{16}$ are the same or different and are each independently integers ranging from 0 to 4, and $b^7$ and $b^8$ are the same or different and are each independently integers ranging from 0 to 10

The cardo-based resin may be a compound represented by the following Chemical Formula 6.

[Chemical Formula 6]

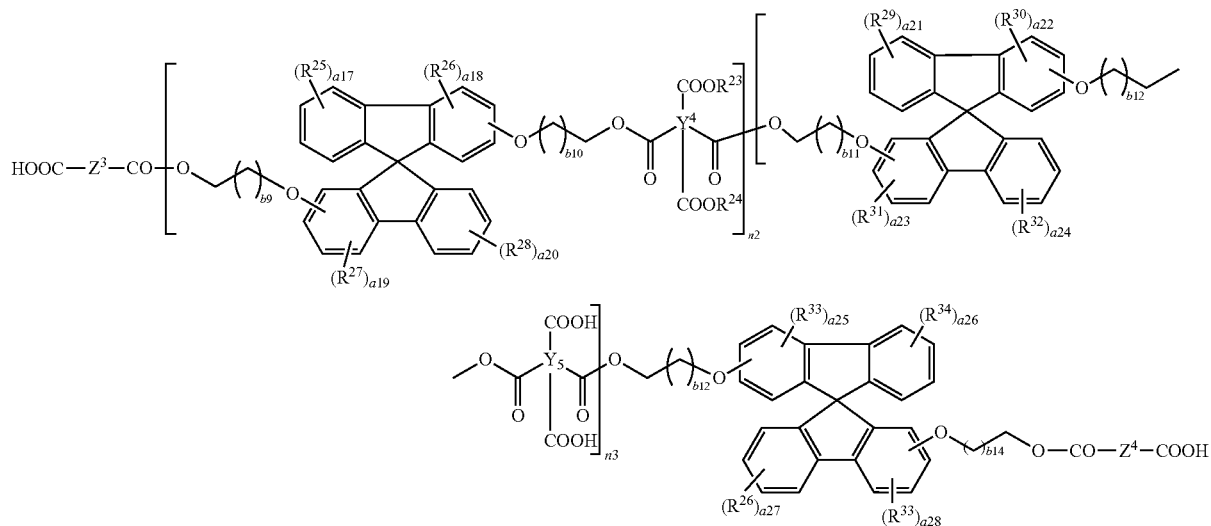

In the above Chemical Formula 6, $Y^4$ and $Y^5$ are the same or different and are each independently a residual group of acid dianhydride, $Z^3$ and $Z^4$ are the same or different and are each independently a residual group of acid anhydride, $R^{23}$ and $R^{24}$ are the same or different and are each independently hydrogen, substituted or unsubstituted C1 to C20 alkyl, substituted or unsubstituted C2 to C20 alkenyl, substituted or unsubstituted C2 to C20 alkynyl, substituted or unsubstituted C1 to C20 alkoxy, substituted or unsubstituted C3 to C20 cycloalkyl, substituted or unsubstituted C3 to C20 cycloalkenyl, substituted or unsubstituted C3 to C20 cycloalkynyl, substituted or unsubstituted C6 to C30 aryl, or substituted or unsubstituted (meth)acrylate, wherein at least one of $R^{23}$ and $R^{24}$ is substituted or unsubstituted (meth)acrylate, $R^{25}$ to $R^{36}$ are the same or different and are each independently substituted or unsubstituted C1 to C20 alkyl, substituted or unsubstituted C2 to C20 alkenyl, substituted or unsubstituted C2 to C20 alkynyl, substituted or unsubstituted C1 to C20 alkoxy, substituted or unsubstituted C3 to C20 cycloalkyl, substituted or unsubstituted C3 to C20 cycloalkenyl, substituted or unsubstituted C3 to C20 cycloalkynyl, or substituted or unsubstituted C6 to C30 aryl, $a^{17}$ to $a^{28}$ are the same or different and are each independently integers ranging from 0 to 4, $b^9$ to $b^{14}$ are the same or different and are each independently integers ranging from 0 to 10, and $n^2$ and $n^3$ are the same or different and are each independently integers ranging from 1 to 10.

The cardo-based resin (B) may have a weight average molecular weight of about 1,000 to about 20,000 g/mol.

The cardo-based resin may include a first cardo-based resin having a weight average molecular weight of greater than or equal to about 1,000 g/mol and less than about 6,500 g/mol and a second cardo-based resin having a weight average molecular weight of greater than about 6,500 g/mol and less than or equal to about 20,000 g/mol.

The cardo-based resin may include the first cardo-based resin and the second cardo-based resin in a weight ratio of about 1:9 to about 9:1.

The colorant may include a dye, a pigment, or a combination thereof.

The pigment may include an organic pigment, an inorganic pigment, or a combination thereof, the organic pigment may include a black organic pigment, and the inorganic pigment may include carbon black, chromium oxide, iron oxide, titan black, titanium carbide, aniline black, or a combination thereof.

The photosensitive resin composition may include about 0.5 to about 30 wt % of the binder resin (A); about 1 to about 20 wt % of the photopolymerizable monomer (B); about 0.1 to about 10 wt % of the photopolymerization initiator (C); about 1 to about 50 wt % of the colorant (D); and balance of the solvent (E).

Another embodiment provides a light blocking layer manufactured using the photosensitive resin composition.

The light blocking layer may have a pattern having a film step difference, in which a pattern tilt angle is in a range of about 20 to about 50°.

Other embodiments are included in the following detailed description.

The present invention may form a light blocking layer pattern having a film step difference by using a photosensitive resin composition having excellent pattern-forming capability, developability, and chemical resistance as well as capable of controlling a pattern tilt angle and accordingly, can provide a black matrix and a column spacer in one process, simultaneously.

DETAILED DESCRIPTION

Figure 1:
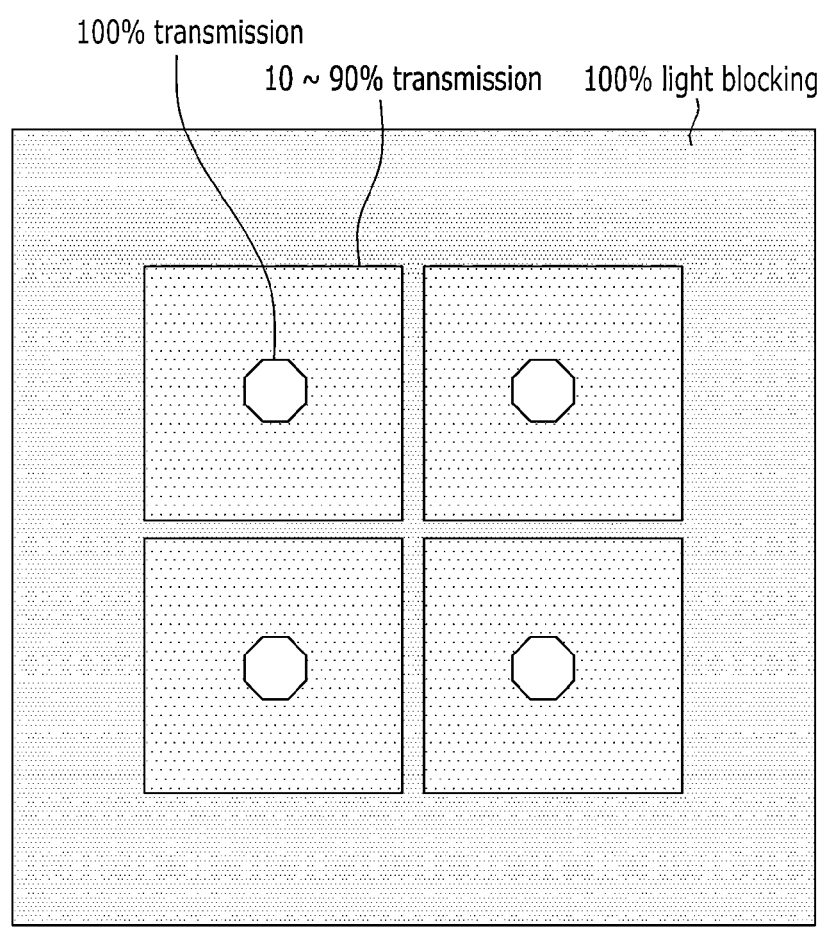
FIG. 1 is a schematic view showing one shape of a mask used to form a pattern during the manufacture of a light blocking layer according to one embodiment.

The present invention will be described more fully hereinafter in the following detailed description of the invention, in which some but not all embodiments of the invention are described. Indeed, this invention may be embodied in many different forms and should not be construed as limited to the embodiments set forth herein; rather, these embodiments are provided so that this disclosure will satisfy applicable legal requirements.

As used herein, when a specific definition is not otherwise provided, the term "substituted" refers to one substituted with a substituent including halogen (F, Cl, Br or I), a hydroxyl group, a C1 to C20 alkoxy group, a nitro group, a cyano group, an amine group, an imino group, an azido group, an amidino group, a hydrazino group, a hydrazono group, a carbonyl group, a carbamyl group, a thiol group, an ester group, an ether group, a carboxyl group or a salt thereof, a sulfonic acid group or a salt thereof, a phosphoric acid group or a salt thereof, a C1 to C20 alkyl group, a C2 to C20 alkenyl group, a C2 to C20 alkynyl group, a C6 to C30 aryl group, a C3 to C20 cycloalkyl group, a C3 to C20 cycloalkenyl group, a C3 to C20 cycloalkynyl group, a C2 to C20 heterocycloalkyl group, a C2 to C20 heterocycloalkenyl group, a C2 to C20 heterocycloalkynyl group, a C3 to C30 heteroaryl group, or a combination thereof, instead of at least one hydrogen.

As used herein, when a specific definition is not otherwise provided, the term "hetero" may refer to a cyclic compound substituted with at least one hetero atom of N, O, S and/or P, in place of at least one C (carbon atom) of the cyclic compound.

As used herein, when a specific definition is not otherwise provided, "(meth)acrylate" refers to both "acrylate" and "methacrylate", and "(meth)acrylic acid" refers to "acrylic acid" and "methacrylic acid".

The photosensitive resin composition according to one embodiment includes (A) a binder resin, (B) a photopolymerizable monomer, (C) a photopolymerization initiator, (D) a colorant, and (E) a solvent.

Hereinafter, each component is described in detail.

(A) Binder Resin

In one embodiment, the binder resin may be a cardo-based resin. The cardo-based resin may be a compound including a repeating unit represented by the following Chemical Formula 1.

[Chemical Formula 1]

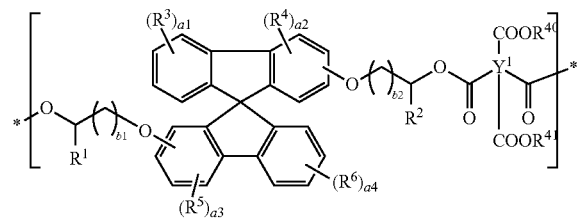

In the above Chemical Formula 1,
$Y^1$ is a residual group of acid dianhydride, $R^1$, $R^2$, $R^{40}$ and $R^{41}$ are the same or different and are each independently hydrogen, substituted or unsubstituted C1 to C20 alkyl, substituted or unsubstituted C2 to C20 alkenyl, substituted or unsubstituted C2 to C20 alkynyl, substituted or unsubstituted C1 to C20 alkoxy, substituted or unsubstituted C3 to C20 cycloalkyl, substituted or unsubstituted C3 to C20 cycloalkenyl, substituted or unsubstituted C3 to C20 cycloalkynyl, substituted or unsubstituted C6 to C30 aryl, or substituted or unsubstituted (meth)acrylate, wherein at least one of $R^1$ and $R^2$, or at least one of $R^{40}$ and $R^{41}$ is substituted or unsubstituted (meth)acrylate, $R^3$ to $R^6$ are the same or different and are each independently substituted or unsubstituted C1 to C20 alkyl, substituted or unsubstituted C2 to C20 alkenyl, substituted or unsubstituted C2 to C20 alkynyl, substituted or unsubstituted C1 to C20 alkoxy, substituted or unsubstituted C3 to C20 cycloalkyl, substituted or unsubstituted C3 to C20 cycloalkenyl, substituted or unsubstituted C3 to C20 cycloalkynyl, or substituted or unsubstituted C6 to C30 aryl, $a^1$ to $a^4$ are the same or different and are each independently integers ranging from 0 to 4, and $b^1$ and $b^2$ are the same or different and are each independently integers ranging from 0 to 10.

The cardo-based resin may improve heat resistance, chemical resistance, and/or close-contacting (adhesive) properties of the photosensitive resin composition.

In addition, the cardo-based resin according to one embodiment can have a spirobifluorene backbone shown in the above Chemical Formula 1. The spirobifluorene backbone can have a stable stereo-structure having high rigidity. This cardo-based resin may maintain film step difference of a pattern realized after development during the post baking due to decreased melting characteristics. In other words, the cardo-based resin according to one embodiment can have a structure having small fluidity and may adjust a pattern tilt angle in a pattern having a film step difference when included in the photosensitive resin composition.

The cardo-based resin may include at least one (meth)acrylate group as in the above Chemical Formula 1. The (meth)acrylate group participates in a reaction for forming a pattern during the exposure and may improve sensitivity of the pattern.

In addition, since the cardo-based resin is synthesized by introducing the (meth)acrylate group in the last step after synthesis of a polymer including a residual group of acid dianhydride substituted with a carboxyl group, a substituent of the (meth)acrylate group may be adjusted. Accordingly, melting characteristic of the cardo-based resin and sensitivity of a pattern due to its rigidity structure may be adjusted.

The cardo-based resin including the repeating unit represented by the above Chemical Formula 1 may be specifically a compound represented by the following Chemical Formula 2.

[Chemical Formula 2]

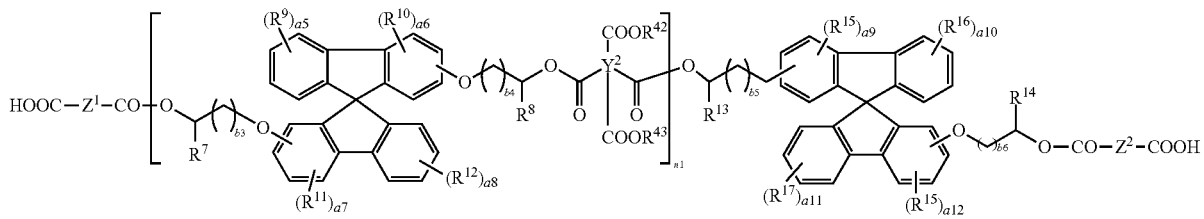

In the above Chemical Formula 2,
$Y^2$ is a residual group of acid dianhydride,
$Z^1$ and $Z^2$ are the same or different and are each independently a residual group of acid anhydride,
$R^7$, $R^8$, $R^{13}$, $R^{14}$, $R^{42}$ and $R^{43}$ are the same or different and are each independently hydrogen, substituted or unsubstituted C1 to C20 alkyl, substituted or unsubstituted C2 to C20 alkenyl, substituted or unsubstituted C2 to C20 alkynyl, substituted or unsubstituted C1 to C20 alkoxy, substituted or unsubstituted C3 to C20 cycloalkyl, substituted or unsubstituted C3 to C20 cycloalkenyl, substituted or unsubstituted C3 to C20 cycloalkynyl, substituted or unsubstituted C6 to C30 aryl, or substituted or unsubstituted (meth)acrylate, wherein at least one of $R^7$ and $R^8$, at least one of $R^{13}$ and $R^{14}$, or at least one of $R^{42}$ and $R^{43}$ is independently substituted or unsubstituted (meth)acrylate, $R^9$ to $R^{12}$ and $R^{15}$ to $R^{18}$ are the same or different and are each independently substituted or unsubstituted C1 to C20 alkyl, substituted or unsubstituted C2 to C20 alkenyl, substituted or unsubstituted C2 to C20 alkynyl, substituted or unsubstituted C1 to C20 alkoxy, substituted or unsubstituted C3 to C20 cycloalkyl, substituted or unsubstituted C3 to C20 cycloalkenyl, substituted or unsubstituted C3 to C20 cycloalkynyl, or substituted or unsubstituted C6 to C30 aryl, $a^5$ to $a^{12}$ are the same or different and are each independently integers ranging from 0 to 4, $b^3$ to $b^6$ are the same or different and are each independently integers ranging from 0 to 10, and $n^1$ is an integer ranging from 1 to 20.

The cardo-based resin may be more specifically a compound represented by the following Chemical Formula 3 and/or a compound represented by the following Chemical Formula 4.

[Chemical Formula 3]

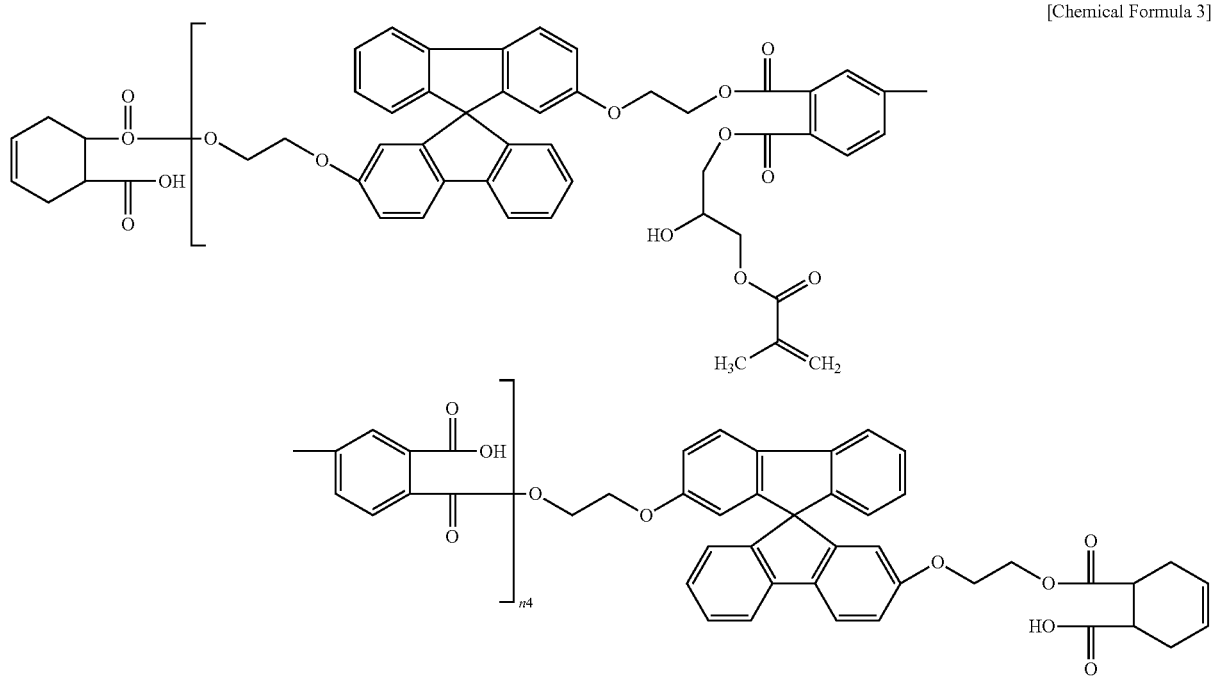

In the above Chemical Formula 3, $n^4$ is an integer ranging from 1 to 20.

[Chemical Formula 4]

In the above Chemical Formula 4, $n^7$ is an integer ranging from 1 to 20.

When $R^1$ and $R^2$ are hydrogen, and at least one of $R^{40}$ and $R^{41}$ is the substituted or unsubstituted (meth)acrylate group in the above Chemical Formula 1, the cardo-based resin may further include a repeating unit represented by the following Chemical Formula 5.

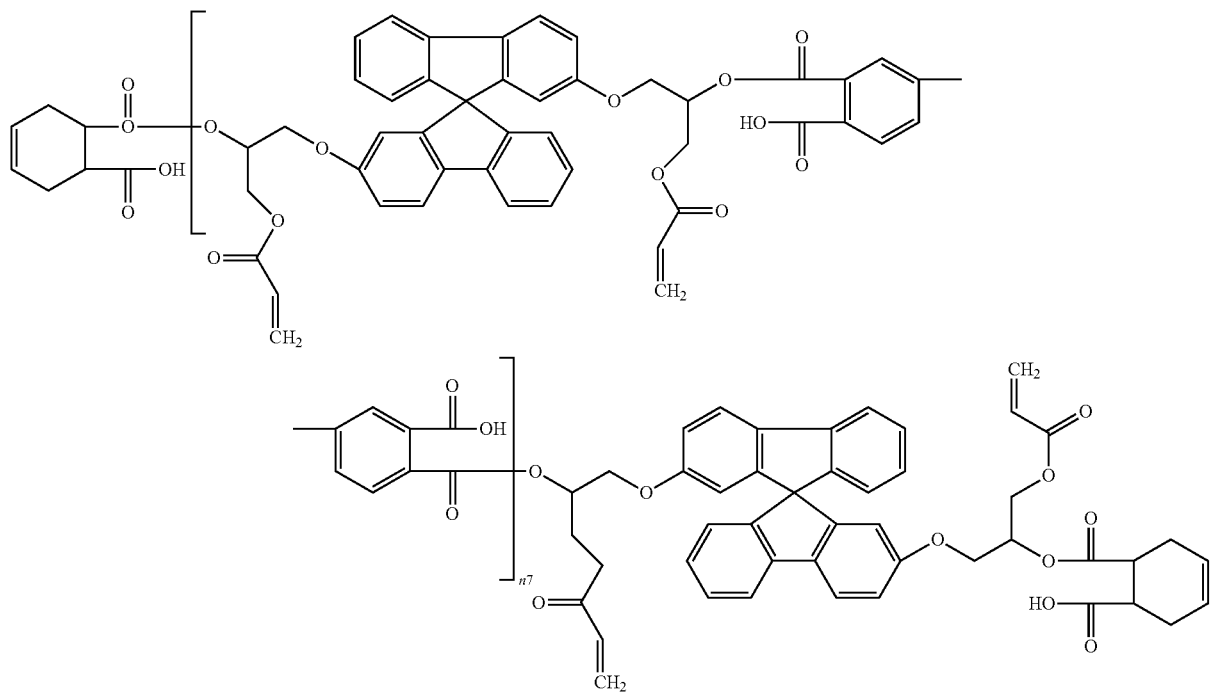

[Chemical Formula 5]

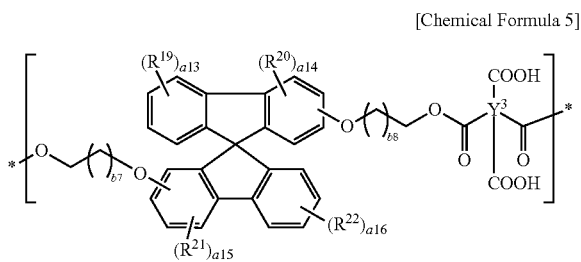

In the above Chemical Formula 5, $Y^3$ is a residual group of acid dianhydride, $R^{19}$ to $R^{22}$ are the same or different and are each independently substituted or unsubstituted C1 to C20 alkyl, substituted or unsubstituted C2 to C20 alkenyl, substituted or unsubstituted C2 to C20 alkynyl, substituted or unsubstituted C1 to C20 alkoxy, substituted or unsubstituted C3 to C20 cycloalkyl, substituted or unsubstituted C3 to C20 cycloalkenyl, substituted or unsubstituted C3 to C20 cycloalkynyl, or substituted or unsubstituted C6 to C30 aryl, $a^{13}$ to $a^{16}$ are the same or different and are each independently integers ranging from 0 to 4, and $b^7$ and $b^8$ are the same or different and are each independently integers ranging from 0 to 10.

When $R^1$ and $R^2$ are hydrogen, and at least one of $R^{40}$ and $R^{41}$ is the substituted or unsubstituted (meth)acrylate group, the cardo-based resin including the repeating unit represented by the above Chemical Formula 1 and the repeating unit represented by the above Chemical Formula 5 may be specifically a compound represented by the following Chemical Formula 6.

[Chemical Formula 6]

In the above Chemical Formula 6, $Y^4$ and $Y^5$ are the same or different and are each a residual group of acid dianhydride, $Z^3$ and $Z^4$ are the same or different and are each independently a residual group of acid anhydride, $R^{23}$ and $R^{24}$ are the same or different and are each independently hydrogen, substituted or unsubstituted C1 to C20 alkyl, substituted or unsubstituted C2 to C20 alkenyl, substituted or unsubstituted C2 to C20 alkynyl, substituted or unsubstituted C1 to C20 alkoxy, substituted or unsubstituted C3 to C20 cycloalkyl, substituted or unsubstituted C3 to C20 cycloalkenyl, substituted or unsubstituted C3 to C20 cycloalkynyl, substituted or unsubstituted C6 to C30 aryl, or substituted or unsubstituted (meth)acrylate, wherein at least one of $R^{23}$ and $R^{24}$ is substituted or unsubstituted (meth)acrylate, $R^{25}$ to $R^{36}$ are the same or different and are each independently substituted or unsubstituted C1 to C20 alkyl, substituted or unsubstituted C2 to C20 alkenyl, substituted or unsubstituted C2 to C20 alkynyl, substituted or unsubstituted C1 to C20 alkoxy, substituted or unsubstituted C3 to C20 cycloalkyl, substituted or unsubstituted C3 to C20 cycloalkenyl, substituted or unsubstituted C3 to C20 cycloalkynyl, or substituted or unsubstituted C6 to C30 aryl, $a^{17}$ to $a^{28}$ the same or different and are each are independently integers ranging from 0 to 4, $b^9$ to $b^{14}$ are the same or different and are each independently integers ranging from 0 to 10, and $n^2$ and $n^3$ are the same or different and are each independently integers ranging from 1 to 10.

The compound represented by the above Chemical Formula 6 may be more specifically represented by the following Chemical Formula 7.

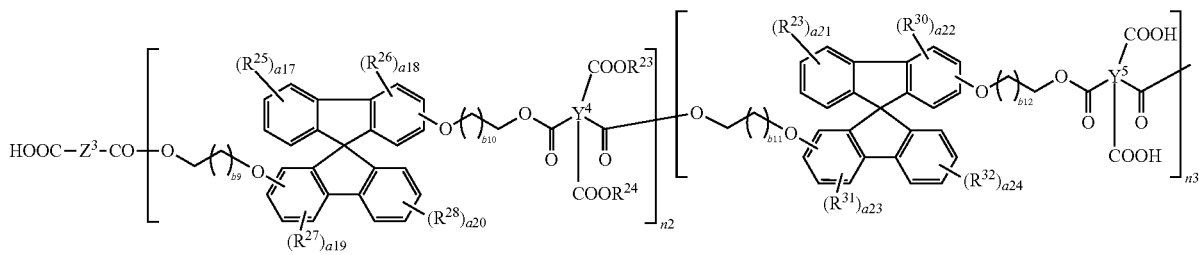

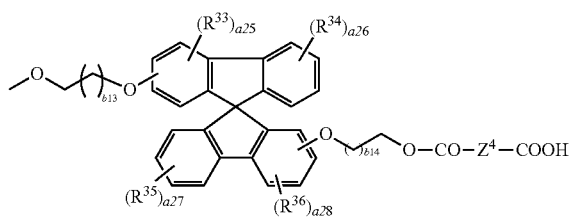

[Chemical Formula 7]

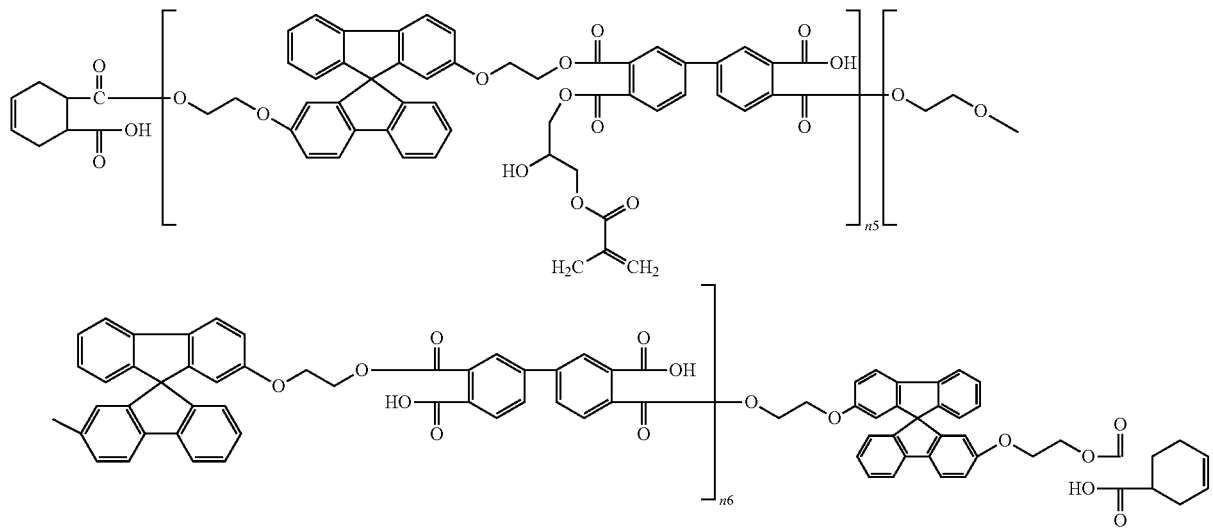

In the above Chemical Formula 7, $n^5$ and $n^6$ are the same or different and are each independently integers ranging from 1 to 10

The cardo-based resin (B) may have a weight average molecular weight of about 1,000 to about 20,000 g/mol, for example about 3,000 to about 10,000 g/mol. Within the above range of the weight average molecular weight, during manufacture of a light blocking layer, excellent pattern and developability may be provided.

The cardo-based resin including a repeating unit wherein at least one of $R^1$ and $R^2$ is the substituted or unsubstituted (meth)acrylate group and $R^{40}$ and $R^{41}$ are hydrogen in the above Chemical Formula 1 may include two kinds of cardo-based resins having a different molecular weight from each other. Specifically, the cardo-based resin may include a mixture of a first cardo-based resin having a weight average molecular weight of greater than or equal to about 1,000 g/mol and less than about 6,500 g/mol and a second cardo-based resin having a weight average molecular weight of greater than about 6,500 g/mol and less than or equal to about 20,000 g/mol. Herein, the first cardo-based resin and the second cardo-based resin may be mixed in a weight ratio of about 1:9 to about 9:1, for example in a weight ratio of about 4:6 to about 6:4. When the two kinds of cardo-based resins having a different molecular weight from each other are mixed within the above weight ratio range, viscosity may be maintained appropriately and excellent pattern and developability may be obtained during manufacture of a light blocking layer.

The binder resin may further include an acrylic-based resin as well as the above-described cardo-based resin.

The acrylic-based resin is a copolymer of a first ethylenic unsaturated monomer and a second ethylenic unsaturated monomer that is copolymerizable with the first ethylenic unsaturated monomer, and is a resin including at least one acrylic-based repeating unit.

The first ethylenic unsaturated monomer is an ethylenic unsaturated monomer including at least one carboxyl group. Examples of the monomer include without limitation acrylic acid, methacrylic acid, maleic acid, itaconic acid, fumaric acid, and the like, and combinations thereof.

The acrylic-based binder resin may include the first ethylenic unsaturated monomer in an amount ranging from about 5 to about 50 wt %, for example, from about 10 to about 40 wt %, based on the total amount (weight) of the acrylic-based resin. In some embodiments, the acrylic-based binder resin may include the first ethylenic unsaturated monomer in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 wt %. Further, according to some embodiments of the present invention, the amount of the first ethylenic unsaturated monomer can be in a range from about any of the foregoing amounts to about any other of the foregoing amounts.

Examples of the second ethylenic unsaturated monomer may include without limitation aromatic vinyl compounds such as styrene, α-methylstyrene, vinyltoluene, vinylbenzylmethylether, and the like; unsaturated carboxylic acid ester compounds such as methyl(meth)acrylate, ethyl(meth)acrylate, butyl(meth)acrylate, 2-hydroxyethyl(meth)acrylate, 2-hydroxy butyl(meth)acrylate, benzyl(meth)acrylate, cyclohexyl(meth)acrylate, phenyl(meth)acrylate, and the like; unsaturated carboxylic acid amino alkyl ester compounds such as 2-aminoethyl(meth)acrylate, 2-dimethylaminoethyl (meth)acrylate, and the like; carboxylic acid vinyl ester compounds such as vinyl acetate, vinyl benzoate, and the like; unsaturated carboxylic acid glycidyl ester compounds such as glycidyl(meth)acrylate and the like; vinyl cyanide compounds such as (meth)acrylonitrile and the like; unsaturated amide compounds such as (meth)acrylamide and the like; and the like. They may be used singularly or as a mixture of more than two.

Examples of the acrylic-based resin may include without limitation methacrylic acid/benzylmethacrylate/styrene copolymers, methacrylic acid/benzylmethacrylate/2-hydroxyethylmethacrylate copolymers, methacrylic acid/benzyl methacrylate/styrene/2-hydroxyethylmethacrylate copolymers, and the like, but are not limited thereto. They may be used singularly or as a mixture of two or more.

The acrylic-based resin may have a weight average molecular weight ranging from about 3,000 to about 150,000 g/mol, for example, about 5,000 to about 50,000 g/mol, and as another example about 2,000 to about 30,000 g/mol. When the acrylic-based resin has a weight average molecular weight within the above range, the photosensitive resin composition can have good physical and/or chemical properties, appropriate viscosity, and/or close-contacting (adhesive) properties with a substrate during manufacture of a light blocking layer.

The acrylic-based resin may have an acid value ranging from about 15 to about 60 mgKOH/g, for example about 20 to about 50 mgKOH/g. When acrylic-based resin has an acid value within the above range, excellent pixel resolution may be realized.

The photosensitive resin composition may include the binder resin in an amount of about 0.5 to about 30 wt %, for example about 1 to about 25 wt %, based on the total amount (weight) of the photosensitive resin composition. In some embodiments, the photosensitive resin composition may include the binder resin in an amount of about 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 wt %. Further, according to some embodiments of the present invention, the amount of the binder resin can be in a range from about any of the foregoing amounts to about any other of the foregoing amounts.

When the binder resin is included in an amount within the above range, viscosity may be maintained appropriately and excellent pattern, processability, and developability may be obtained during manufacture of a light blocking layer.

(B) Photopolymerizable Monomer

The photopolymerizable monomer may be mono-functional and/or multifunctional ester of (meth)acrylic acid including at least one ethylenic unsaturated double bond.

The photopolymerizable monomer causes sufficient polymerization at exposure during pattern forming processes to form patterns that can have excellent heat resistance, light resistance, and/or chemical resistance, due to the ethylenic unsaturated double bond.

Examples of the photopolymerizable monomer may include without limitation ethylene glycol di(meth)acrylate, diethylene glycol di(meth)acrylate, triethylene glycol di(meth)acrylate, propylene glycol di(meth)acrylate, neopentyl glycol di(meth)acrylate, 1,4-butanediol di(meth)acrylate, 1,6-hexanediol di(meth)acrylate, bisphenol A di(meth) acrylate, pentaerythritol di(meth)acrylate, pentaerythritol tri(meth)acrylate, pentaerythritol tetra(meth)acrylate, pentaerythritol hexa(meth)acrylate, dipentaerythritol di(meth)acrylate, dipentaerythritol tri(meth)acrylate, dipentaerythritol penta(meth)acrylate, dipentaerythritol hexa(meth)acrylate, bisphenol A epoxy(meth)acrylate, ethylene glycol monomethylether (meth)acrylate, trimethylol propane tri(meth)acrylate, tris(meth)acryloyloxyethyl phosphate, novolacepoxy (meth)acrylate, and the like, and combinations thereof.

Commercially available examples of the photopolymerizable monomer are as follows. The mono-functional (meth) acrylic acid ester may include without limitation Aronix M-101®, M-111®, M-114® (TOAGOSEI CHEMICAL INDUSTRY CO., LTD.); KAYARAD TC-110S®, TC-120S® (NIPPON KAYAKU CO., LTD.); V-158®, V-2311® (OSAKA ORGANIC CHEMICAL IND., LTD.), and the like. Examples of a difunctional (meth)acrylic acid ester may include without limitation Aronix M-210®, M-240®, M-6200® (TOAGOSEI CHEMICAL INDUSTRY CO., LTD.), KAYARAD HDDA®, HX-220®, R-604® (NIPPON KAYAKU CO., LTD.), V-260®, V-312®, V-335 HP® (OSAKA ORGANIC CHEMICAL IND., LTD.), and the like. Examples of a tri-functional (meth)acrylic acid ester may include without limitation Aronix M-309®, M-400®, M-405®, M-450®, M-7100®, M-8030®, M-8060® (TOAGOSEI CHEMICAL INDUSTRY CO., LTD.), KAYARAD TMPTA®, DPCA-20®, DPCA-30®, DPCA-60®, DPCA-120® (NIPPON KAYAKU CO., LTD.), V-295®, V-300®, V-360®, V-GPT®, V-3PA®, V-400® (Osaka Yuki Kayaku Kogyo Co. Ltd.), and the like. The commercially available products may be used singularly or as a mixture of two or more kinds.

The photopolymerizable monomer may be treated with acid anhydride to improve developability.

The photosensitive resin composition may include the photopolymerizable monomer in an amount ranging from about 1 to about 20 wt %, for example about 1 to about 15 wt % based on the total amount of the photosensitive resin composition. In some embodiments, the photosensitive resin composition may include the photopolymerization monomer in an amount of about 1, 2, 3, 4, 5, 6, 7, 8, 9, 10, 11, 12, 13, 14, 15, 16, 17, 18, 19, or 20 wt %. Further, according to some embodiments of the present invention, the amount of the photopolymerization monomer can be in a range from about any of the foregoing amounts to about any other of the foregoing amounts.

When the photopolymerizable monomer is included in an amount within the above range, curing at exposure during pattern forming processes can be sufficiently performed, and the photopolymerizable monomer can have good sensitivity under oxygen, and compatibility with the binder resin.

(C) Photopolymerization Initiator

The photopolymerization initiator may be a generally-used initiator in a photosensitive resin composition. Examples of the photopolymerization initiator may include without limitation acetophenone-based compounds, benzophenone-based compounds, thioxanthone-based compounds, benzoin-based compounds, triazine-based compounds, and the like, and combinations thereof.

Examples of the acetophenone-based compound include without limitation 2,2'-diethoxy acetophenone, 2,2'-dibutoxy acetophenone, 2-hydroxy-2-methylpropinophenone, p-t-butyltrichloro acetophenone, p-t-butyldichloro acetophenone, 4-chloro acetophenone, 2,2'-dichloro-4-phenoxy acetophenone, 2-methyl-1-(4-(methylthio)phenyl)-2-morpholinopropan-1-one, 2-benzyl-2-dimethylamino-1-(4-morpholinophenyl)-butan-1-one, and the like, and combinations thereof.

Examples of the benzophenone-based compound include without limitation benzophenone, benzoyl benzoate, benzoyl methyl benzoate, 4-phenyl benzophenone, hydroxy benzophenone, acrylated benzophenone, 4,4'-bis(dimethyl amino)benzophenone, 4,4'-bis(diethylamino)benzophenone, 4,4'-dimethylaminobenzophenone, 4,4'-dichlorobenzophenone, 3,3'-dimethyl-2-methoxybenzophenone, and the like, and combinations thereof.

Examples of the thioxanthone-based compound include without limitation thioxanthone, 2-methylthioxanthone, isopropyl thioxanthone, 2,4-diethyl thioxanthone, 2,4-diisopropyl thioxanthone, 2-chlorothioxanthone, and the like, and combinations thereof.

Examples of the benzoin-based compound include without limitation benzoin, benzoin methyl ether, benzoin ethyl ether, benzoin isopropyl ether, benzoin isobutyl ether, benzyldimethylketal, and the like, and combinations thereof.

Examples of the triazine-based compound include without limitation 2,4,6-trichloro-s-triazine, 2-phenyl 4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloromethyl)-s-triazine, 2-biphenyl 4,6-bis(trichloromethyl)-s-triazine, bis(trichloromethyl)-6-styryl-s-triazine, 2-(naphto-1-yl)-4,6-bis(trichloromethyl)-s-triazine, 2-(4-methoxynaphto-1-yl)-4,6-bis(trichloromethyl)-s-triazine, 2-4-trichloromethyl(piperonyl)-6-triazine, 2-4-trichloromethyl(4'-methoxystyryl)-6-triazine, and the like, and combinations thereof.

The photopolymerization initiator may further include a carbazole-based compound, a diketone-based compound, a sulfonium borate-based compound, a diazo-based compound, a biimidazole-based compound, and the like and combinations thereof, in addition to or as an alternative to the aforementioned photopolymerization initiators.

The photopolymerization initiator absorbs light and is excited and then transmits energy, and it may be used with a photo-sensitizer causing a chemical reaction.

The photosensitive resin composition may include the photopolymerization initiator in an amount of about 0.1 to about 10 wt %, for example about 0.5 to about 3 wt %, based on the total amount (weight) of the photosensitive resin composition. In some embodiments, the photosensitive resin composition may include the photopolymerization initiator in an amount of about 0.1, 0.2, 0.3, 0.4, 0.5, 0.6, 0.7, 0.8, 0.9, 1, 2, 3, 4, 5, 6, 7, 8, 9, or 10 wt %. Further, according to some embodiments of the present invention, the amount of the photopolymerization initiator can be in a range from about any of the foregoing amounts to about any other of the foregoing amounts.

When the photopolymerization initiator is included in an amount within the above range, sensitivity of a radical and/or color concentration of a photosensitive resin composition solution can be maintained appropriately, and decrease in transmittance due to non-reacting initiators transmittance may be prevented.

(D) Colorant

The colorant may include a dye, a pigment or a combination thereof.

The pigment may include an organic pigment, an inorganic pigment, or a combination thereof. To implement a high optical density, the organic pigment and the inorganic pigment may be mixed.

The organic pigment may be a black organic pigment. The black organic pigment can have insulation properties.

Examples of the black organic pigment may include without limitation perylene black, cyanine black, and the like, and may be used singularly or in a mixture of two or more.

The black organic pigment may be a mixture of two or more kinds of organic pigments to show a black color. Combinations of any pigment showing a black color by mixing in a color coordinate pigment may be used. For example blackening combinations of at least two pigments selected from red pigments, blue pigments, green pigments, violet-based pigments, yellow-based pigments, cyanine-based pigments, and margenta-based pigments may be used. For example, a blackening mixture of a red pigment, a blue pigment, and a green pigment may be used, or a blackening mixture of a green pigment and a violet-based pigment may be used.

Examples of the red pigment may include without limitation perylene-based pigments, anthraquinone-based pigments, dianthraquinone-based pigments, azo-based pigments, diazo-based pigments, quinacridone-based pigments, anthracene-based pigments, and the like, and combinations thereof. For example, the red pigment may include a perylene pigment, a quinacridone pigment, a naphthol AS, a sicomin pigment, an anthraquinone (sudan I, II, III, R), dianthraquinonylate, bis azo, benzopyrane, and the like, or a combination thereof.

Examples of the blue pigment may include without limitation metal phthalocyanine-based pigments, indanthone-based pigments, indophenol-based pigments, and the like, and combinations thereof. Specific examples of the blue pigment may include without limitation phthalocyanine metal complexes such as copper phthalocyanine, chloro copper phthalocyanine, chloro aluminum phthalocyanine, titanyl phthalocyanine, vanadic acid phthalocyanine, magnesium phthalocyanine, zinc phthalocyanine, iron phthalocyanine, cobalt phthalocyanine, and the like, and combinations thereof.

Examples of the green pigment may include without limitation halogenated phthalocyanine-based pigments, and the like, and combinations thereof. For example, the green pigment may include polychloro copper phthalocyanine, polychloro bromo phthalocyanine, and the like, or a combination thereof.

Examples of the violet-based pigment may include without limitation dioxazine violet, first violet B, methyl violet, indanthrene brilliant violet, and the like, and combinations thereof.

Examples of the yellow-based pigment may include without limitation tetrachloro isoindolinone-based pigments, hansa-based pigments, benzidine yellow-based pigments, azo-based pigments, and the like, and combinations thereof. For example, the yellow-based pigment may include hansa yellow (10G, 5G, 3G, G, GR, A, RN, R), benzidine (G, GR), chrome yellow, permanent yellow (FGL, H10G, HR), anthracene, and the like, or a combination thereof.

Examples of the cyanine-based pigment may include without limitation non-metal phthalocyanine, merocyanine, and the like, and combinations thereof.

Examples of the magenta-based pigment may include without limitation dimethyl quinacridone, thio indigo, and the like, and combinations thereof.

Examples of the inorganic pigment may include without limitation carbon black, chromium oxide, iron oxide, titan black, titanium carbide, aniline black, and the like. Such an inorganic pigment can have high resistance characteristics, and may be used singularly or in a mixture of two or more kinds.

The organic pigment and the inorganic pigment may be used in a weight ratio of about 1 to about 10:1, for example about 2 to 7:about 1. Within the weight ratio range, processability may be stable, and a low dielectric constant may be provided.

The photosensitive resin composition may further include a dispersing agent in order to improve dispersion of the pigment.

The pigment may be surface-pretreated with a dispersing agent, or the pigment and dispersing agent may be added together during preparation of the photosensitive resin composition.

Examples of the dye may include without limitation triphenylmethane-based dyes, anthraquinone-based dyes, azo-based dyes, and the like, and combinations thereof. In exemplary embodiments, a mixture of the triphenylmethane-based dye and at least one of the anthraquinone-based and azo-based dye may be used.

The photosensitive resin composition may include the colorant in an amount of about 1 to about 50 wt %, for example about 5 to about 45 wt %, based on the total amount (weight) of the photosensitive resin composition. In some embodiments, the photosensitive resin composition may include the colorant in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 wt %. Further, according to some embodiments of the present invention, the amount of the colorant can be in a range from about any of the foregoing amounts to about any other of the foregoing amounts.

When the colorant is included in an amount within the above range, insulating properties may be improved, and high optical density and improved processability such as developability, and the like may be provided.

(E) Solvent

Examples of the solvent may include without limitation alcohols such as methanol, ethanol, and the like; ethers such as dichloroethyl ether, n-butyl ether, diisoamyl ether, methylphenyl ether, tetrahydrofuran, and the like; glycol ethers such as ethylene glycol methylether, ethylene glycol dimethylether, ethylene glycol ethylether, propylene glycol monomethylether, and the like; cellosolve acetates such as methyl cellosolve acetate, ethyl cellosolve acetate, diethyl cellosolve acetate, and the like; carbitols such as methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetates such as propylene glycol methylether acetate, propylene glycol propylether acetate, and the like; aromatic hydrocarbons such as toluene, xylene, and the like; ketones such as methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic monocarboxylic acid alkyl ester such as ethyl acetate, n-butyl acetate, isobutyl acetate, and the like; lactate alkyl esters such as methyl lactate, ethyl lactate, and the like; alkyl hydroxy acetate ester such as methyl hydroxyacetate, ethyl hydroxyacetate, butyl hydroxyacetate, and the like; alkoxyalkyl acetate esters such as methoxymethyl acetate, methoxyethyl acetate, methoxybutyl acetate, ethoxymethyl acetate, ethoxyethyl acetate, and the like; alkyl 3-hydroxypropionate ester such as methyl 3-hydroxypropionate, ethyl 3-hydroxypropionate, and the like; alkyl 3-alkoxypropionate esters such as methyl 3-methoxypropionate, ethyl 3-methoxypropionate, ethyl 3-ethoxypropionate, methyl 3-ethoxypropionate, and the like; alkyl 2-hydroxypropionate ester such as methyl 2-hydroxypropionate, ethyl 2-hydroxypropionate, propyl 2-hydroxypropionate, and the like; alkyl 2-alkoxypropionate ester such as methyl 2-methoxypropionate, ethyl 2-methoxypropionate, ethyl 2-ethoxypropionate, methyl 2-ethoxypropionate, and the like; alkyl 2-hydroxy-2-methylpropionate esters such as methyl 2-hydroxy-2-methylpropionate, ethyl 2-hydroxy-2-methylpropionate, and the like; alkyl 2-alkoxy-2-methylpropionate esters such as methyl 2-methoxy-2-methylpropionate, ethyl 2-ethoxy-2-methylpropionate, and the like; esters such as 2-hydroxyethyl propionate, 2-hydroxy-2-methylethyl propionate, hydroxyethyl acetate, methyl 2-hydroxy-3-methylbutanoate, and the like; ketonate esters such as ethyl pyruvate, and the like. Additionally, the following solvents may be also used: N-methylformamide, N,N-dimethyl formamide, N-methylformanilide, N-methylacetamide, N,N-dimethyl acetamide, N-methylpyrrolidone, dimethylsulfoxide, benzylethylether, dihexylether, acetylacetone, isophorone, caproic acid, caprylic acid, 1-octanol, 1-nonanol, benzylalcohol, benzyl acetate, ethyl benzoate, diethyl oxalate, diethyl maleate, γ-butyrolactone, ethylene carbonate, propylene carbonate, phenyl cellosolve acetate, and the like. These solvents may be used singularly or as a mixture of two or more.

The solvent, considering miscibility and reactivity, may include glycol ethers such as ethylene glycol monoethylether, ethylene glycol dimethylether, and the like; ethylene glycol alkylether acetates such as ethyl cellosolve acetate, and the like; esters such as 2-hydroxy ethyl propionate, and the like; diethylene glycols such as diethylene glycol monomethylether, and the like; propylene glycol alkylether acetates such as propylene glycol methylether acetate, propylene glycol propylether acetate, and the like, and combinations thereof.

The photosensitive resin composition can include the solvent in a balance amount, for example about 30 to about 70 wt %, based on the total amount (weight) of the photosensitive resin composition. In some embodiments, the photosensitive resin composition may include the solvent in an amount of about 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, or 70 wt %. Further, according to some embodiments of the present invention, the amount of the solvent can be in a range from about any of the foregoing amounts to about any other of the foregoing amounts.

When the solvent is included in an amount within the above range, the photosensitive resin composition may have an appropriate viscosity resulting in improvement of processability.

(F) Other Additive(s)

The photosensitive resin composition may further include one or more other additives. Examples of the additives can include without limitation malonic acid; 3-amino-1,2-propanediol; silane-based coupling agents including a vinyl group and/or a (meth)acryloxy group; leveling agents; fluorine-based surfactants; radical polymerization initiators, and the like, and combinations thereof, to prevent stains or spots during the coating, to adjust leveling, and/or to prevent pattern residue due to non-development.

Examples of the silane-based coupling agent may include without limitation trimethoxysilyl benzoic acid, γ-methacryl oxypropyl trimethoxysilane, vinyl triacetoxysilane, vinyl trimethoxysilane, γ-iso cyanate propyl triethoxysilane, γ-glycidoxy propyl trimethoxysilane, R-(3,4-epoxycyclohexyl)ethyltrimethoxysilane, and the like. They may be used singularly or as a mixture of two or more.

Examples of the fluorine-based surfactant may include without limitation commercial products, for example BM-1000®, and BM-1100® (BM Chemie Inc.); MEGAFACE F 142D®, F 172®, F 173®, and F 183® DAINIPPON INK KAGAKU KOGYO CO., LTD.); FULORAD FC-135®, FULORAD FC-170C®, FULORAD FC-430®, and FULORAD FC-431® (SUMITOMO 3M CO., LTD.); SURFLON S-112®, SURFLON S-113®, SURFLON S-131®, SURFLON S-141®, and SURFLON S-145® (ASAHI GLASS CO., LTD.); and SH-28PA®, SH-190®, SH-193®, SZ-6032®, and SF-8428®, and the like (TORAY SILICONE CO., LTD.), and combinations thereof.

The amount of the additive(s) may be easily adjusted depending on desired properties.

According to another embodiment, a light blocking layer manufactured using the photosensitive resin composition is provided.

The light blocking layer may be manufactured as follows.

(1) Coating and Film Formation

The photosensitive resin composition can be coated to have a desired thickness, for example, a thickness ranging from about 0.5 to about 25 μm, on a substrate which undergoes a predetermined pretreatment, using a spin or slit coating method, a roll coating method, a screen-printing method, an applicator method, and the like. Then, the coated substrate can be heated at a temperature ranging from about 70 to about 110° C. for about 1 to about 10 minutes to remove a solvent.

(2) Exposure

The resultant film can be radiated by an active ray of about 190 to about 500 nm after placing a mask with a predetermined shape to form a desired pattern.

Figure 2:
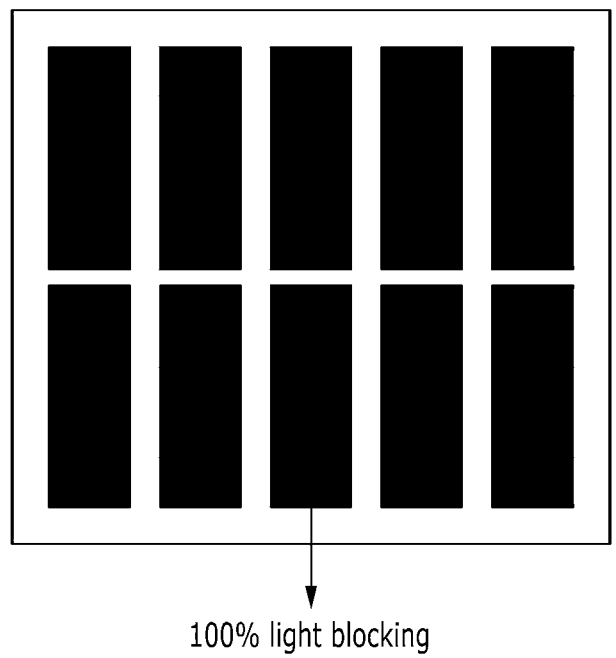
FIG. 2 is a schematic view showing another shape of a mask used to form a pattern during the manufacture of a light blocking layer according to one embodiment.
Figure 3:
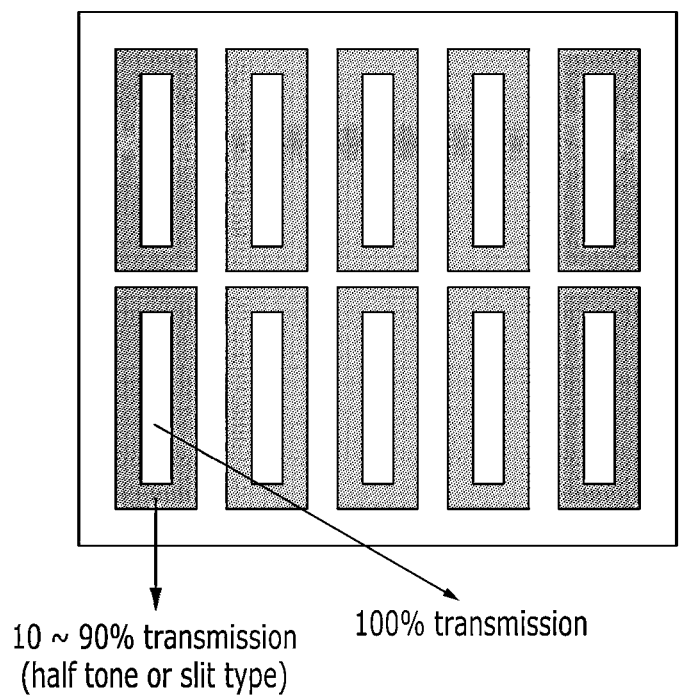
FIG. 3 is a schematic view showing yet another kind of a mask used to form a pattern during the manufacture of a light blocking layer according to one embodiment.

The mask may have various shapes, such as a shape provided in FIGS. 1 to 3.

FIG. 1 is a schematic view showing a mask shape used for forming a pattern during the manufacture of a light blocking layer according to one embodiment.

FIG. 1 is a mask having a region of blocking 100% light, a region of transmitting 100% light, and a region of transmitting 10 to 90% light. In FIG. 1, the region of transmitting 10 to 90% light may have a half tone or slit shape. The mask shape may form a film step difference between more exposed region and less exposed region. Specifically, the 100% exposed region through the region of transmitting 100% light of the mask may form a column spacer, while the less exposed region through the region of transmitting 10 to 90% light may form a black matrix. Accordingly, a region of the black matrix may have a step difference.

FIG. 2 is a schematic view showing a mask having one shape for forming a pattern during manufacture of a light blocking layer according to another embodiment, and FIG. 3 is a schematic view showing a mask having another shape for forming a pattern during manufacture of a light blocking layer according to yet another embodiment.

FIG. 2 shows a mask having a region of blocking 100% light, and FIG. 3 shows a mask having a region of transmitting 10 to 90% light. In FIG. 3, the region of transmitting 10 to 90% light may have a half tone or slit shape.

Specifically, the half tone mask or the slit mask in FIGS. 1 and 3 may be used to form a film step difference between more and less exposed regions.

The radiation can be performed by using a light source such as a mercury lamp with a low pressure, a high pressure, or an ultrahigh pressure, a metal halide lamp, an argon gas laser, and the like. An X ray, an electron beam, and the like may be also used.

Exposure process uses, for example, a light dose of about 500 mJ/cm² or less (with about 365 nm sensor) when a high pressure mercury lamp is used. However, the light dose may vary depending on kinds of each component of the photosensitive resin composition, its combination ratio, and a dry film thickness.

(3) Development

After the exposure process, an alkali aqueous solution can be used to develop the exposed film by dissolving and removing an unnecessary part except the exposed part, forming an image pattern.

(4) Post-Treatment

The developed image pattern may be heated again or radiated by an active ray and the like for curing, in order to accomplish excellent quality in terms of heat resistance, photo resistance, close-contacting properties, crack-resistance, chemical resistance, high strength, storage stability, and the like.

Therefore, the photosensitive resin composition may exhibit excellent close-contacting (adhesive) properties and optical density required for a light blocking layer.

The light blocking layer manufactured using the photosensitive resin composition according to one embodiment can have a pattern having a film step difference, in which a tilt angle may be in a range of about 20 to about 50°, for example, about 20 to about 35°. The film step difference between the more and less exposed regions can be formed using half tone and slit masks through exposure and development during the formation of a pattern and may be maintained due to decreased melting characteristic of the photosensitive resin composition according to one embodiment despite a post-baking process as a post-treatment and thus can maintain a tilt angle of greater than or equal to about 20° in the pattern having the film step difference. For example, a black column spacer simultaneously functioning as a black matrix and column spacer may be realized.

Hereinafter, the present invention is illustrated in more detail with reference to examples. These examples, however, are not in any sense to be interpreted as limiting the scope of the invention.

Preparation of Cardo-Based Resin

Preparation Example 1

(1) 50 g of 9,9'-spirobifluorene (TCI Inc.) and 500 ml of carbon disulfide ($CS_2$, Aldrich-Sigma Co., Ltd.) are put in a 1 L reactor and heated up to 45° C., 31 g of acetyl chloride (Aldrich-Sigma Co., Ltd.) and 10 g of aluminum chloride (Aldrich-Sigma Co., Ltd.) are added thereto, and the mixture is agitated for 10 hours. When the reaction is complete, the carbon disulfide is distillated under a reduced pressure, 500 ml of dichloro methane and 300 ml of water are added into the reactor, the mixture is agitated at room temperature for 2 hours, and an organic layer is separated and distillated under a reduced pressure and treated through a silica gel column, obtaining a compound represented by the following Chemical Formula 8.

[Chemical Formula 8]

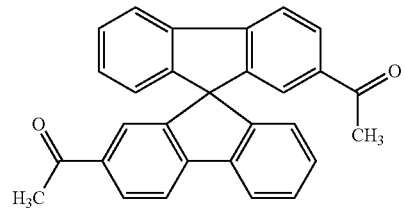 [SMILES: CC(=O)c1ccc2c(c1)C1(c3ccccc3-2)c2ccccc2-c2ccc(C(C)=O)cc21]

(2) 60 g of a compound represented by the above Chemical Formula 8 and 40 g of metachloroperoxy benzoic acid (Aldrich-Sigma Co., Ltd.) are put in a 1 L reactor, 500 ml of dichloro methane is added thereto, the mixture is heated up to 43° C. and agitated for 8 hours, 200 ml of water is added thereto, the resulting mixture is agitated at room temperature for 30 minutes, and then, an organic layer is separated and distillated under a reduced pressure and then, treated through a silica gel column, obtaining a compound represented by the following Chemical Formula 9.

[Chemical Formula 9]

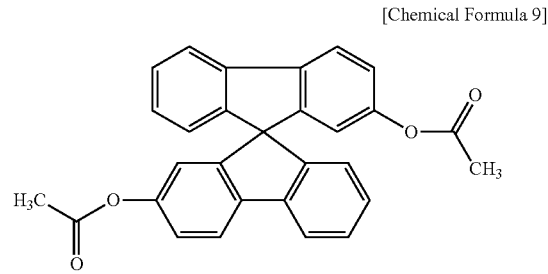 [SMILES: CC(=O)Oc1ccc2c(c1)C1(c3ccccc3-2)c2ccccc2-c2ccc(OC(C)=O)cc21]

(3) 50 g of a compound represented by the above Chemical Formula 9, 300 ml of methanol (Aldrich-Sigma Co., Ltd.), and 200 ml of a 6N NaOH aqueous solution are put in a 500 ml reactor and agitated at room temperature for 20 hours, and then, distillated under a reduced pressure, a 1N HCl aqueous solution is used to adjust its pH into 5, and an organic layer is extracted using 500 ml of dichloro methane and distillated under a reduced pressure, treated through a silica gel column, obtaining a compound represented by the following Chemical Formula 10.

[Chemical Formula 10]

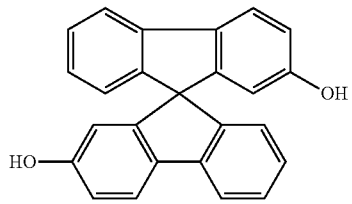

[Chemical Formula 11]

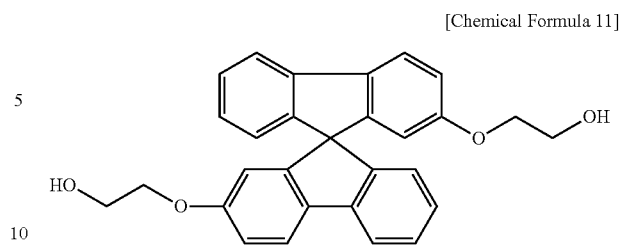

(4) 50 g of a compound represented by the above Chemical Formula 10, 24 g of 2-hydroxyethylchloride (Aldrich-Sigma Co., Ltd.), 60 g of potassium carbonate (anhydride) (Aldrich-Sigma Co., Ltd.), and 300 g of dimethylformamide (Aldrich-Sigma Co., Ltd.) are put in a 500 ml reactor and then, heated up to 100° C., agitated for 6 hours, and cooled down, the resultant is added to 2 L of water for one hour for precipitation, and a precipitate is filtered and washed and then, dried in a 50° C. vacuum oven for 12 hours, obtaining a compound represented by the following Chemical Formula 11.

(5) 50 g of a compound represented by the above Chemical Formula 11, 18.5 g of biphenyltetracarboxylic acid dianhydride (Aldrich-Sigma Co., Ltd.), 7.1 g of tetrahydrophthanhydride (Aldrich-Sigma Co., Ltd.), 0.5 g of tetramethylammonium chloride, and 65 g of propyleneglycolmethylether acetate are put in a 1 L reactor and agitated at 120° C. for 6 hours, obtaining a compound represented by the following Chemical Formula 12 and having 49.3 wt % of a solid content, 132 mgKOH/g of an acid value, and 4,800 g/mol of a weight average molecular weight.

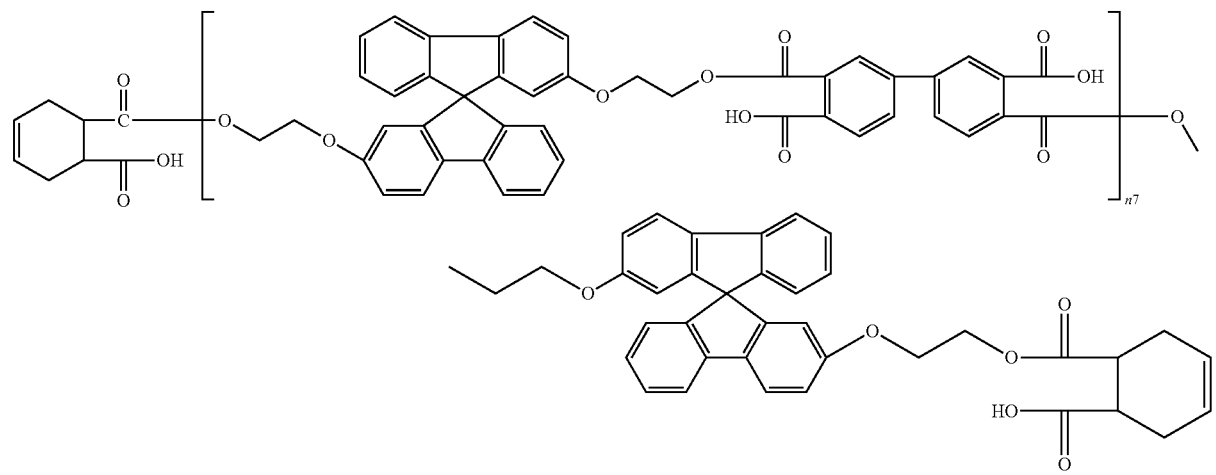

(6) 4.3 g of glycidyl methacrylate (Aldrich-Sigma Co., Ltd.), 2.5 g of tetrahydrophthanhydride (Aldrich-Sigma Co., Ltd.), and 0.5 g of tetramethylammonium chloride is added to a reaction solution including the compound represented by the above Chemical Formula 12 in a 1 L reactor, and the mixture is agitated at 120° C. for 6 hour, obtaining a cardo-based resin represented by the following Chemical Formula 13 and having a solid content of 39.3 wt % and a weight average molecular weight of 4,900 g/mol.

[Chemical Formula 13]

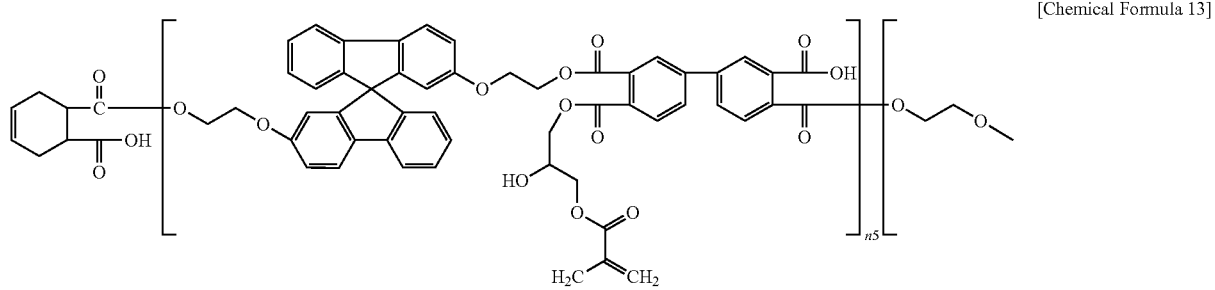

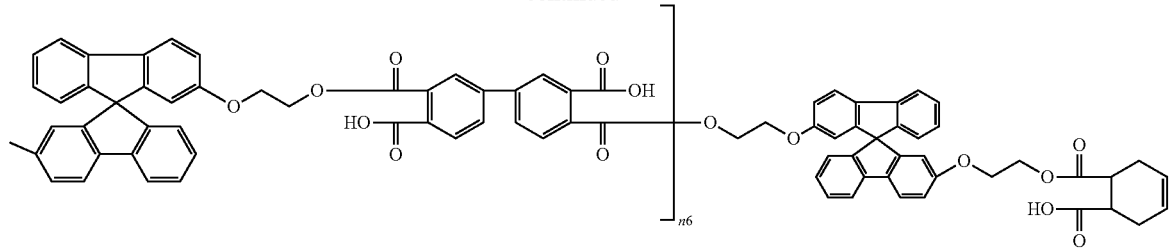

Preparation Example 2

(1) 50 g of the compound represented above Chemical Formula 10 according to Preparation Example 1, 40 g of epichlorohydrin (Aldrich-Sigma Co., Ltd.), 60 g of anhydrous potassium carbonate, and 500 ml of dimethylformamide are put in a 1 L reactor and then, heated up to 80° C., agitated for 8 hours, and cooled down, the reactant is added to 3 L of water in a reactor in a dropwise fashion for 2 hours to obtain a crystal, and the crystal is recrystallized using dichloro methane and diethylether, obtaining a compound represented by the following Chemical Formula 14.

[Chemical Formula 14]

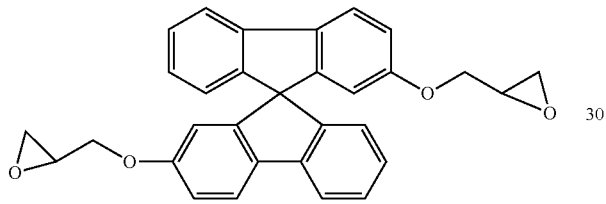

(2) 50 g of the compound represented by the above Chemical Formula 14, 16.5 g of acrylic acid (Aldrich-Sigma Co., Ltd.), 1 g of triphenylphosphine (Aldrich-Sigma Co., Ltd.), and 200 g of propyleneglycol methylether acetate (Daicel Co.) are put in a 1 L reactor, heated up to 110° C., and agitated for 8 hours, obtaining a reaction solution including a compound represented by the following Chemical Formula 15.

[Chemical Formula 15]

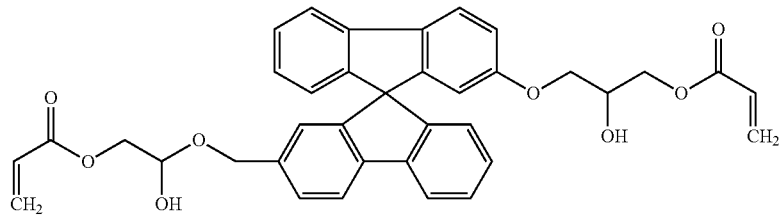

(3) A reaction solution including the compound represented by the above Chemical Formula 15, 9.7 g of biphenyltetracarboxylic acid dianhydride (Aldrich-Sigma Co., Ltd.), 2.5 g of tetrahydrophthanhydride (Aldrich-Sigma Co., Ltd), and 0.5 g of tetramethylammonium chloride are put in a 1 L reactor and agitated at 120° C. for 6 hour, preparing a cardo-based resin represented by the following Chemical Formula 4 and having a solid content of 39.3 wt % and a weight average molecular weight of 5,400 g/mol.

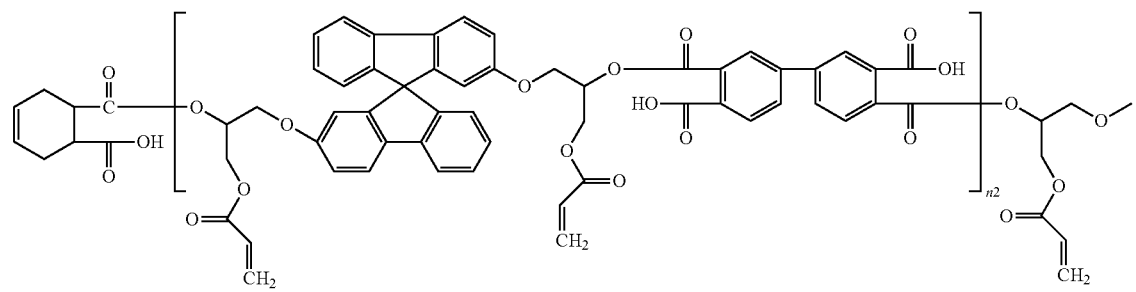

-continued

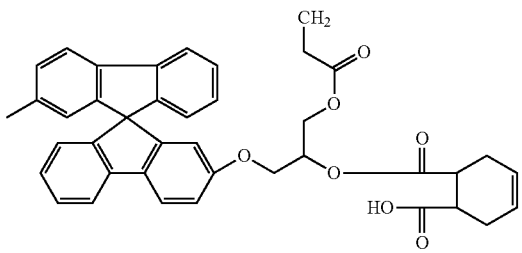

Preparation Example 3

A reaction solution including the compound represented by the above Chemical Formula 15, 10.2 g of biphenyltetracarboxylic acid dianhydride (Aldrich-Sigma Co., Ltd.), 2.0 g of tetrahydrophthanhydride (Aldrich-Sigma Co., Ltd.), and 0.5 g of tetramethylammonium chloride are put in a 1 L reactor and agitated at 120° C. for 6 hours, preparing a cardo-based resin having a solid content of 39.3 wt % and a weight average molecular weight of 7,500 g/mol and represented by the above Chemical Formula 4.

(Preparation of Photosensitive Resin Composition)

A photosensitive resin composition is prepared using the following components.

(A) Binder Resin (A-1) The compound prepared according to Preparation Example 1 is used.

(A-2) The compound prepared according to Preparation Example 2 is used.

(A-3) The compound prepared according to Preparation Example 3 is used.

(A-4) V259ME including a solid content of 55 wt % (Nippon Steel Chemical Corp.) is used.

(A-5) CF-61 including a solid content of 32 wt % (Wako Chemicals Inc.) is used.

(B) Photopolymerizable Monomer

Dipentaerythritolhexaacrylate is used.

(C) Photopolymerization Initiator (C-1) OXE02 made by Ciba Corp. is used.

(C-2) IGR907 made by Ciba-Geigy Ltd. is used.

(D) Colorant (D-1) A pigment dispersion (TCZ-121, Mikuni) including red, blue, and violet pigments as a main component is used.

(D-2) A pigment dispersion dispersed by an organic black pigment (TCZ-180, Mikuni) is used.

(D-3) A pigment dispersion including carbon black (C1-M-050, Sakata Inc.) is used.

(E) Solvent

Propylene glycol monomethylether acetate is used.

(F) Additive (F-1) F-475 made by DIC Co., Ltd. as a surfactant is used.

(F-2) Aminopropyl trimethoxysilane (S-710, Chisso Co.) as a silane coupling agent is used.

(F-3) γ-glycidoxy propyl trimethoxysilane (S-510, Chisso Co.) as a silane coupling agent is used.

Examples 1 to 6 and Comparative Examples 1 to 7

Photosensitive resin compositions are prepared by mixing each component in the following Table 1. Specifically, a photopolymerization initiator is dissolved in a solvent, and the solution is agitated at room temperature for about 30 minutes. A binder resin and a photopolymerizable monomer are added thereto, and the mixture is agitated for one hour. Then, an additive is added to the resultant, a colorant is added thereto, and the mixture is agitated for about 2 hours. The solution is three times filtered to remove impurities, preparing photosensitive resin compositions.

TABLE 1

| | | Examples | | | Comparative Examples | | | | (wt%) |
|---|---|---|---|---|---|---|---|---|---|
| | | 1 | 2 | 3 | 1 | 2 | 3 | 4 | |
| (A) binder resin | A-1 | 22 | 10 | 22 | — | — | — | — | |
| | A-4 | — | — | — | 18.5 | 7 | 18.5 | — | |
| | A-5 | — | — | — | — | 11.5 | — | 22 | |
| (B) photopolymerizable monomer | | 2.5 | 2.5 | 2.5 | 2.5 | 2.5 | 2.5 | 2.5 | |
| (C) photopolymerization initiator | C-1 | 0.25 | 0.25 | 0.25 | 0.25 | 0.25 | 0.25 | 0.25 | |
| | C-2 | 0.35 | 0.35 | 0.35 | 0.35 | 0.35 | 0.35 | 0.35 | |
| (D) colorant | D-1 | 41 | 41 | — | 41 | 41 | — | 41 | |
| | D-2 | — | — | 36 | — | — | 36 | — | |
| | D-3 | — | — | 5 | — | — | 5 | — | |
| (E) solvent | | 33.1 | 45.1 | 33.1 | 36.6 | 36.6 | 36.6 | 33.1 | |
| (F) additive | F-1 | 0.3 | 0.3 | 0.3 | 0.3 | 0.3 | 0.3 | 0.3 | |
| | F-2 | 0.5 | 0.5 | 0.5 | 0.5 | 0.5 | 0.5 | 0.5 | |

TABLE 2

| | | Examples | | | Comparative Examples | | | (wt%) |
|---|---|---|---|---|---|---|---|---|
| | | 4 | 5 | 6 | 5 | 6 | 7 | |
| (A) binder resin | A-2 | 2 | — | 1 | — | — | — | |
| | A-3 | — | 2 | 1 | — | — | — | |
| | A-4 | — | — | — | 2 | — | 1 | |
| | A-5 | — | — | — | — | 2 | 1 | |
| (B) photopolymerizable monomer | | 1 | 1 | 1 | 1 | 1 | 1 | |
| (C) photopolymerization initiator | C-1 | 0.25 | 0.25 | 0.25 | 0.25 | 0.25 | 0.25 | |
| | C-2 | 0.25 | 0.25 | 0.25 | 0.25 | 0.25 | 0.25 | |

TABLE 2-continued

| | | Examples | | | Comparative Examples | | (wt%) |
|---|---|---|---|---|---|---|---|
| | | 4 | 5 | 6 | 5 | 6 | 7 |
| (D) colorant | D-1 | 40 | 40 | 40 | 40 | 40 | 40 |
| | D-3 | 5 | 5 | 5 | 5 | 5 | 5 |
| (E) solvent | | 51.495 | 51.495 | 51.495 | 51.495 | 51.495 | 51.495 |
| F-3 additive | | 0.005 | 0.005 | 0.005 | 0.005 | 0.005 | 0.005 |

Evaluation 1: Pattern-Forming Capability and Developability Measurement (1) The photosensitive resin compositions according to Examples 1 to 3 and Comparative Examples 1 to 4 are coated on a glass substrate and dried, forming film specimens. The film specimens are exposed to light having a wavelength of 365 nm with 70 mJ/cm$^2$ by using a mask having a shape in FIG. 1. The resulting film specimens are developed in an aqueous solution diluted to include 1 wt % of potassium hydroxide at 23° C. for 1 minute and washed with pure water for 1 minute. The obtained patterns are heated and cured in a 220° C. oven for 30 minutes and shapes of patterns are examined through an optical microscope with the naked eye. The results are provided in the following Table 3 and FIGS. 4 and 5.

Figure 4:
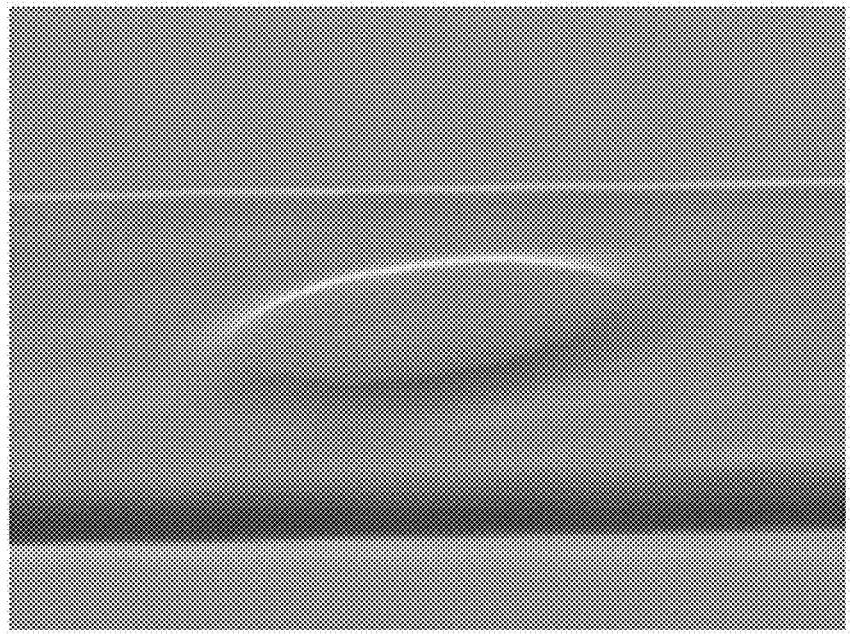
FIG. 4 is a scanning electron microscope (SEM) photograph showing the pattern of a film specimen according to Example 1.
Figure 5:
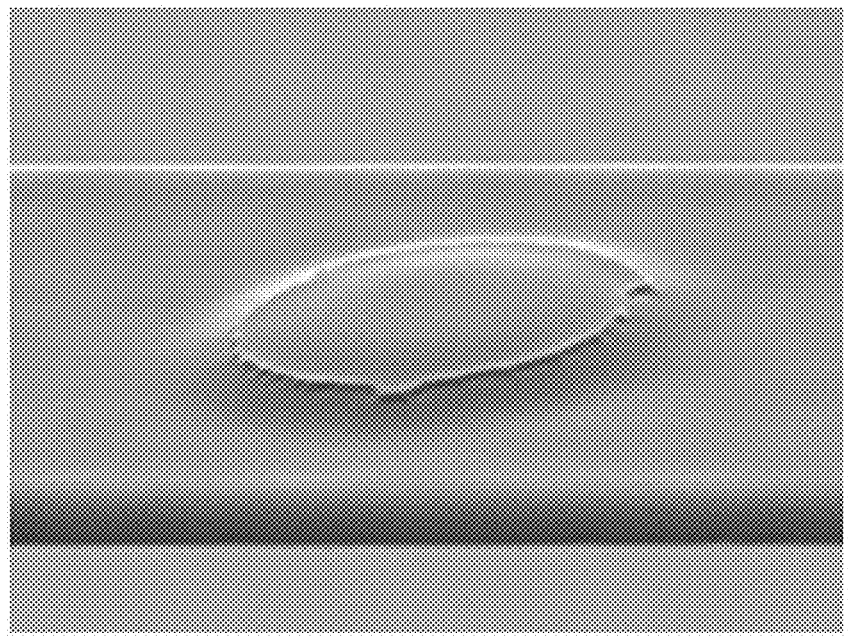
FIG. 5 is a scanning electron microscope (SEM) photograph showing the pattern of a film specimen according to Comparative Example 4.

FIG. 4 is a scanning electron microscope (SEM) photograph showing the pattern of the film specimen according to Example 1, and FIG. 5 is a scanning electron microscope (SEM) photograph showing the pattern of the film specimen according to Comparative Example 4. The films are evaluated with a reference to the following pattern-forming capability reference.

<Pattern-Forming Capability Evaluation Reference>
○: Sufficient 10 µm pattern-forming capability
: Insufficient 10 µm pattern-forming capability
x: No 10 µm pattern formation
<Developability Evaluation Reference>
○: Slow development
x: Tearing off-like development (2) The photosensitive resin compositions according to Examples 4 to 6 and Comparative Examples 5 to 7 are coated on a glass substrate and dried to form film specimens. Each film specimen is exposed to light having a wavelength of 365 nm with 40 mJ/cm$^2$ by using a mask given in FIG. 2. The film specimens are developed in an aqueous solution diluted to include 1 wt % of potassium hydroxide at 23° C. for 1 minute and washed with pure water for 1 minute. The obtained patterns are heated and cured in a 220° C. oven for 30 minutes and shapes of patterns are examined with naked eyes through an optical microscope. The results are provided in the following Table 4 and FIGS. 6 and 7.

Figure 6:
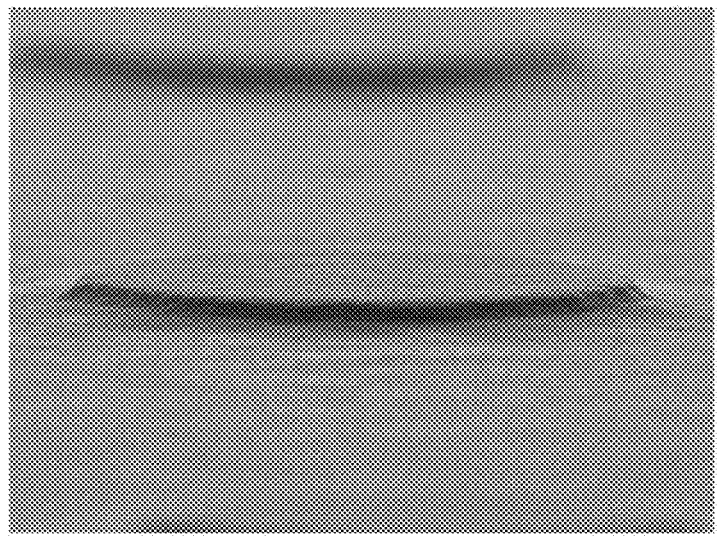
FIG. 6 is a scanning electron microscope (SEM) photograph showing the pattern of a film specimen according to Example 4.
Figure 7:
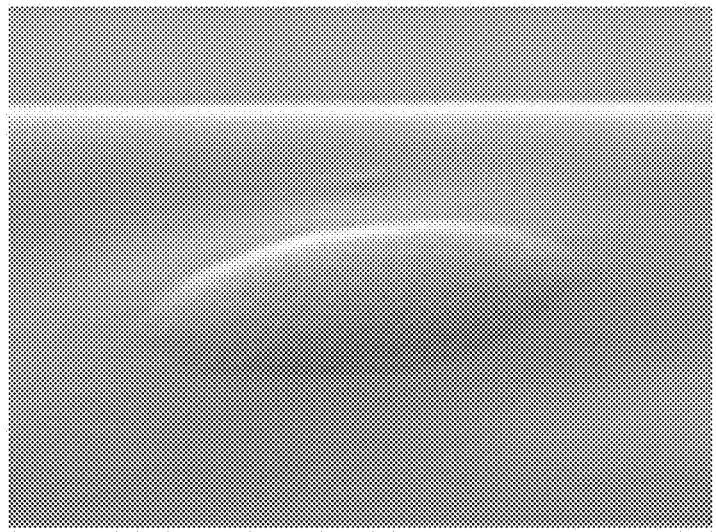
FIG. 7 is a scanning electron microscope (SEM) photograph showing the pattern of a film specimen according to Comparative Example 5.

FIG. 6 is a scanning electron microscope (SEM) photograph showing the pattern of the film specimen according to Example 4, and FIG. 7 is a scanning electron microscope (SEM) photograph showing the pattern of the film specimen according to Comparative Example 5.

<Pattern-Forming Capability Evaluation Reference>
○: Sufficient 35 µm pattern-forming capability
: Insufficient 35 µm pattern-forming capability
x: No 35 µm pattern formation
<Developability Evaluation Reference>
○: Sufficient developability in a KOH aqueous solution
: Insufficient developability in a KOH aqueous solution
x: No developability in a KOH aqueous solution Evaluation 2: Chemical Resistance Measurement (1) Each pattern specimen according to Examples 1 to 3 and Comparative Examples 1 to 4 in Evaluation 1 is cut into a size of 1 cm×1 cm, and then, the eight specimen pieces are put in a 20 ml vial, and 3 g of N-methyl pyrrolidone is added thereto. The specimens are allowed to stand in a 100° C. oven for 10 minutes and examined about color of the N-methylpyrrolidone solution with the naked eye, and the results are provided in the following Table 3.

<Chemical Resistance Evaluation Reference>
○: no color change
: less than or equal to 20% of color change (100% of color change when opaque)
x: greater than or equal to 20% of color change (100% of color change when opaque)

(2) The pattern specimens according to Examples 4 to 6 and Comparative Examples 5 to 7 in Evaluation 1 are examined about a pattern tilt angle with a measuring device, and the results are provided in the following Table 4.

Figure 8:
FIG. 8 is a schematic view showing measurement of a pattern tilt angle in the pattern of a film specimen according to one embodiment.

FIG. 8 is a schematic view showing pattern tilt angles of the pattern specimens. FIG. 8 shows a measured part of the patterns having a film step difference.

<Pattern Tilt Angle Evaluation Reference>
○: greater than or equal to 20°
x: less than 20°

TABLE 3

| | Pattern-forming capability | Developability | Chemical resistance |
|---|---|---|---|
| Example 1 | ○ | ○ | ○ |
| Example 2 | ○ | ○ | ○ |
| Example 3 | ○ | ○ | ○ |
| Comparative Example 1 | ○ | ○ | x |
| Comparative Example 2 | ○ | ○ | x |
| Comparative Example 3 | ○ | ○ | x |
| Comparative Example 4 | x | ○ | x |

TABLE 4

| | Pattern-forming capability | Developability | Pattern tilt angle |
|---|---|---|---|
| Example 4 | ○ | ○ | ○ |
| Example 5 | ○ | ○ | ○ |
| Example 6 | ○ | ○ | ○ |
| Comparative Example 5 | x | ○ | x |
| Comparative Example 6 | x | x | x |
| Comparative Example 7 | x | | x |

Referring to Table 3, the patterns using the cardo-based resin of the embodiment as a binder resin according to Examples 1 to 3 show excellent pattern-forming capability, developability, and chemical resistance compared with the patterns according to Comparative Examples 1 to 4.

In addition, the patterns including the cardo-based resin of one embodiment as a binder resin according to Examples 4 to 6 have excellent pattern-forming capability and greater than or equal to 20° of a pattern tilt angle compared with the patterns according to Comparative Examples 5 to 7 referring to Table 4. Based on the results, the patterns according to the embodiment have an excellent film step difference.

Many modifications and other embodiments of the invention will come to mind to one skilled in the art to which this invention pertains having the benefit of the teachings presented in the foregoing descriptions. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

What is claimed is:

1. A photosensitive resin composition, comprising
    (A) a binder resin including a cardo-based resin including a repeating unit represented by the following Chemical Formula 1;
    (B) a photopolymerizable monomer;
    (C) a photopolymerization initiator;
    (D) a colorant; and
    (E) a solvent:

[Chemical Formula 1]

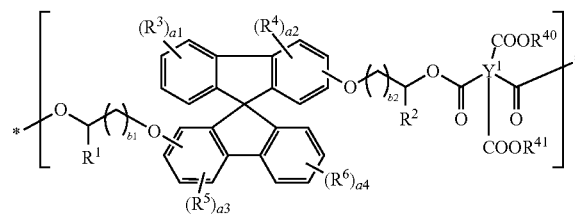

wherein, in the above Chemical Formula 1, $Y^1$ is a residual group of acid dianhydride, $R^1$, $R^2$, $R^{40}$ and $R^{41}$ are the same or different and are each independently hydrogen, substituted or unsubstituted C1 to C20 alkyl, substituted or unsubstituted C2 to C20 alkenyl, substituted or unsubstituted C2 to C20 alkynyl, substituted or unsubstituted C1 to C20 alkoxy, substituted or unsubstituted C3 to C20 cycloalkyl, substituted or unsubstituted C3 to C20 cycloalkenyl, substituted or unsubstituted C3 to C20 cycloalkynyl, substituted or unsubstituted C6 to C30 aryl, or substituted or unsubstituted (meth)acrylate, wherein at least one of $R^1$ and $R^2$, or at least one of $R^{40}$ and $R^{41}$ is substituted or unsubstituted (meth)acrylate, $R^3$ to $R^6$ are the same or different and are each independently substituted or unsubstituted C1 to C20 alkyl, substituted or unsubstituted C2 to C20 alkenyl, substituted or unsubstituted C2 to C20 alkynyl, substituted or unsubstituted C1 to C20 alkoxy, substituted or unsubstituted C3 to C20 cycloalkyl, substituted or unsubstituted C3 to C20 cycloalkenyl, substituted or unsubstituted C3 to C20 cycloalkynyl, or substituted or unsubstituted C6 to C30 aryl, $a^1$ to $a^4$ are the same or different and are each independently integers ranging from 0 to 4, and $b^1$ and $b^2$ are the same or different and are each independently integers ranging from 0 to 10.

2. The photosensitive resin composition of claim 1, wherein the cardo-based resin is a compound represented by the following Chemical Formula 2:

[Chemical Formula 2]

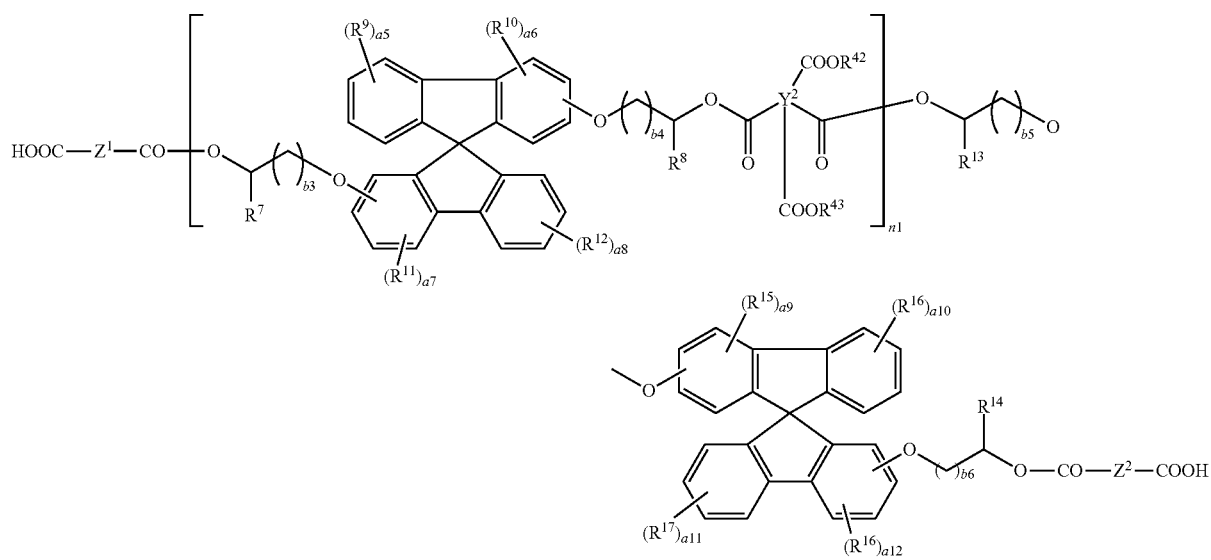

wherein, in the above Chemical Formula 2, $Y^2$ is a residual group of acid dianhydride, $Z^1$ and $Z^2$ are the same or different and are each independently a residual group of acid anhydride, $R^7$, $R^8$, $R^{13}$, $R^{14}$, $R^{42}$ and $R^{43}$ are the same or different and are each independently hydrogen, substituted or unsubstituted C1 to C20 alkyl, substituted or unsubstituted C2 to C20 alkenyl, substituted or unsubstituted C2 to C20 alkynyl, substituted or unsubstituted C1 to C20 alkoxy, substituted or unsubstituted C3 to C20 cycloalkyl, substituted or unsubstituted C3 to C20 cycloalkenyl, substituted or unsubstituted C3 to C20 cycloalkynyl, substituted or unsubstituted C6 to C30 aryl, or substituted or unsubstituted (meth)acrylate, wherein at least one of $R^7$ and $R^8$, at least one of $R^{13}$ and $R^{14}$, or at least one of $R^{42}$ and $R^{43}$ is independently substituted or unsubstituted (meth)acrylate, $R^9$ to $R^{12}$ and $R^{15}$ to $R^{18}$ are the same or different and are each independently substituted or unsubstituted C1 to C20 alkyl, substituted or unsubstituted C2 to C20 alkenyl, substituted or unsubstituted C2 to C20 alkynyl, substituted or unsubstituted C1 to C20 alkoxy, substituted or unsubstituted C3 to C20 cycloalkyl, substituted or unsubstituted C3 to C20 cycloalkenyl, substituted or unsubstituted C3 to C20 cycloalkynyl, or substituted or unsubstituted C6 to C30 aryl, $a^5$ to $a^{12}$ are the same or different and are each independently integers ranging from 0 to 4, $b^3$ to $b^6$ are the same or different and are each independently integers ranging from 0 to 10, and $n^1$ is an integer ranging from 1 to 20.

3. The photosensitive resin composition of claim 1, wherein when $R^1$ and $R^2$ are hydrogen, and at least one of $R^{40}$ and $R^{41}$ is substituted or unsubstituted (meth)acrylate in the above Chemical Formula 1, the cardo-based resin further comprises a repeating unit represented by the following Chemical Formula 5:

[Chemical Formula 5]

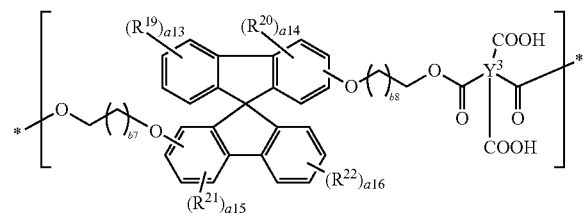

wherein, in the above Chemical Formula 5, $Y^3$ is a residual group of acid dianhydride, $R^{19}$ to $R^{22}$ are the same or different and are each independently substituted or unsubstituted C1 to C20 alkyl, substituted or unsubstituted C2 to C20 alkenyl, substituted or unsubstituted C2 to C20 alkynyl, substituted or unsubstituted C1 to C20 alkoxy, substituted or unsubstituted C3 to C20 cycloalkyl, substituted or unsubstituted C3 to C20 cycloalkenyl, substituted or unsubstituted C3 to C20 cycloalkynyl, or substituted or unsubstituted C6 to C30 aryl, $a^{13}$ to $a^{16}$ are the same or different and are each independently integers ranging from 0 to 4, and $b^7$ and $b^8$ are the same or different and are each independently integers ranging from 0 to 10.

4. The photosensitive resin composition of claim 3, wherein the cardo-based resin is a compound represented by the following Chemical Formula 6

[Chemical Formula 6]

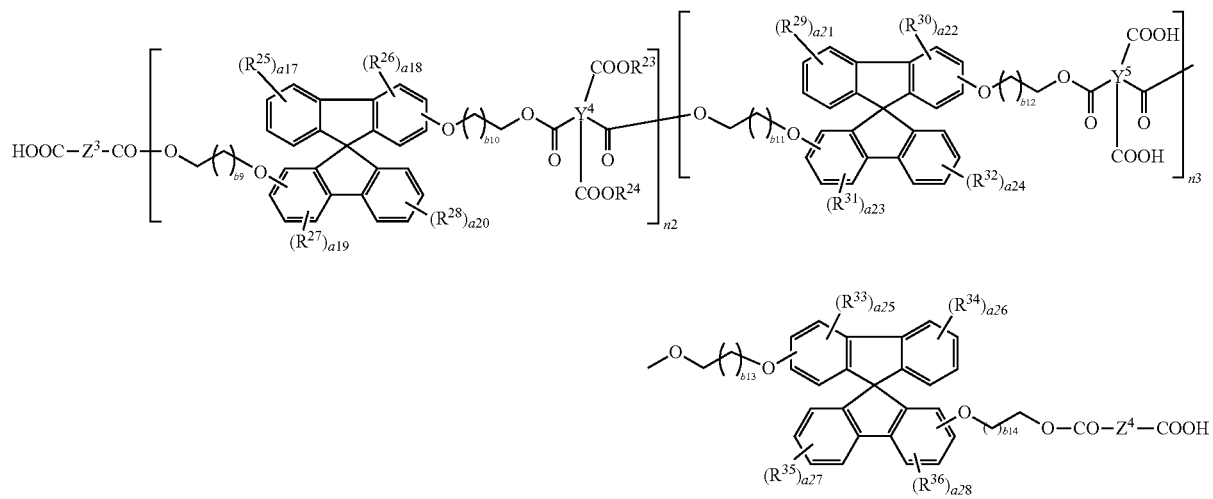

wherein, in the above Chemical Formula 6, $Y^4$ and $Y^5$ are the same or different and are each independently a residual group of acid dianhydride, $Z^3$ and $Z^4$ are the same or different and are each independently a residual group of acid anhydride, $R^{23}$ and $R^{24}$ are the same or different and are each independently hydrogen, substituted or unsubstituted C1 to C20 alkyl, substituted or unsubstituted C2 to C20 alkenyl, substituted or unsubstituted C2 to C20 alkynyl, substituted or unsubstituted C1 to C20 alkoxy, substituted or unsubstituted C3 to C20 cycloalkyl, substituted or unsubstituted C3 to C20 cycloalkenyl, substituted or unsubstituted C3 to C20 cycloalkynyl, substituted or unsubstituted C6 to C30 aryl, or substituted or unsubstituted (meth)acrylate, wherein at least one of $R^{23}$ and $R^{24}$ is substituted or unsubstituted (meth)acrylate, $R^{25}$ to $R^{36}$ are the same or different and are each independently substituted or unsubstituted C1 to C20 alkyl, substituted or unsubstituted C2 to C20 alkenyl, substituted or unsubstituted C2 to C20 alkynyl, substituted or unsubstituted C1 to C20 alkoxy, substituted or unsubstituted C3 to C20 cycloalkyl, substituted or unsubstituted C3 to C20 cycloalkenyl, substituted or unsubstituted C3 to C20 cycloalkynyl, or substituted or unsubstituted C6 to C30 aryl, $a^{17}$ to $a^{28}$ are the same or different and are each independently integers ranging from 0 to 4, $b^9$ to $b^{14}$ are the same or different and are each independently integers ranging from 0 to 10, and $n^2$ and $n^3$ are the same or different and are each independently integers ranging from 1 to 10.

5. The photosensitive resin composition of claim 1, wherein the cardo-based resin has a weight average molecular weight of about 1,000 to about 20,000 g/mol.

6. The photosensitive resin composition of claim 1, wherein the cardo-based resin comprises:
 a first cardo-based resin having a weight average molecular weight of greater than or equal to about 1,000 g/mol and less than about 6,500 g/mol, and
 a second cardo-based resin having a weight average molecular weight of greater than about 6,500 g/mol and less than or equal to about 20,000 g/mol.

7. The photosensitive resin composition of claim 6, wherein the cardo-based resin comprises the first cardo-based resin and the second cardo-based resin in a weight ratio of about 1:9 to about 9:1.

8. The photosensitive resin composition of claim 1, wherein the colorant comprises a dye, a pigment, or a combination thereof.

9. The photosensitive resin composition of claim 8, wherein the pigment comprises an organic pigment, an inorganic pigment, or a combination thereof,
 the organic pigment comprises a black organic pigment, and
 the inorganic pigment comprises carbon black, chromium oxide, iron oxide, titan black, titanium carbide, aniline black, or a combination thereof.

10. The photosensitive resin composition of claim 1, wherein the photosensitive resin composition comprises:
 about 0.5 to about 30 wt % of the binder resin (A);
 about 1 to about 20 wt % of the photopolymerizable monomer (B);
 about 0.1 to about 10 wt % of the photopolymerization initiator (C);
 about 1 to about 50 wt % of the colorant (D); and
 balance of the solvent (E).

11. A light blocking layer manufactured using the photosensitive resin composition of claim 1.

12. The light blocking layer of claim 11, wherein the light blocking layer has a pattern tilt angle ranging from about 20 to about 50° in a pattern having a film step difference.

* * * * *